United States Patent
Lin et al.

(10) Patent No.: US 11,581,226 B2
(45) Date of Patent: Feb. 14, 2023

(54) SEMICONDUCTOR DEVICE WITH TUNABLE EPITAXY STRUCTURES AND METHOD OF FORMING THE SAME

(71) Applicant: Taiwan Semiconductor Manufacturing Co., Ltd., Hsin-Chu (TW)

(72) Inventors: Shih-Hao Lin, Hsinchu (TW); Tzu-Hsiang Hsu, Hsinchu County (TW); Chong-De Lien, Hsinchu (TW); Szu-Chi Yang, Hsinchu (TW); Hsin-Wen Su, Hsinchu (TW); Chih-Hsiang Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 34 days.

(21) Appl. No.: 16/938,340

(22) Filed: Jul. 24, 2020

(65) Prior Publication Data
US 2021/0098311 A1   Apr. 1, 2021

Related U.S. Application Data

(60) Provisional application No. 62/907,368, filed on Sep. 27, 2019.

(51) Int. Cl.
*H01L 21/8238* (2006.01)
*H01L 21/306* (2006.01)
(Continued)

(52) U.S. Cl.
CPC ............... *H01L 21/823814* (2013.01); *H01L 21/30604* (2013.01); *H01L 21/823821* (2013.01); *H01L 27/0924* (2013.01); *H01L 27/1104* (2013.01)

(58) Field of Classification Search
CPC ..... H01L 21/823821; H01L 21/823814; H01L 27/0924; H01L 27/0886; H01L 27/1104; H01L 27/1108
See application file for complete search history.

(56) References Cited

U.S. PATENT DOCUMENTS 8,772,109 B2   7/2014   Colinge et al.
8,785,285 B2   7/2014   Tsai et al.
(Continued)

*Primary Examiner* — Michael M Trinh
(74) *Attorney, Agent, or Firm* — Haynes and Boone, LLP

(57) ABSTRACT

Semiconductor device and the manufacturing method thereof are disclosed herein. An exemplary method comprises forming first and second semiconductor fins in first and second regions of a substrate, respectively; forming first and second dummy gate stacks over the first and second semiconductor fins, respectively, and forming a spacer layer over the first and the second dummy gate stacks; forming a first pattern layer with a thickness along the spacer layer in the first region; form a first source/drain (S/D) trench along the first pattern layer and epitaxially growing a first epitaxial feature therein; removing the first pattern layer to expose the spacer layer; forming a second pattern layer with a different thickness along the spacer layer in the second region; form a second S/D trench along the second pattern layer and epitaxially growing a second epitaxial feature therein; and removing the second pattern layer to expose the spacer layer.

20 Claims, 30 Drawing Sheets

(51) Int. Cl.
     *H01L 27/11*         (2006.01)
     *H01L 27/092*     (2006.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Aw et al. |
| 9,520,482 B1 | 12/2016 | Chang et al. |
| 9,576,814 B2 | 2/2017 | Wu et al. |
| 2014/0273429 A1* | 9/2014 | Wei .................... H01L 29/66545 |
| | | 438/595 |
| 2015/0091059 A1* | 4/2015 | Hung .................... H01L 29/785 |
| | | 257/192 |
| 2017/0352759 A1* | 12/2017 | Kim ...................... H01L 29/165 |
| 2018/0175031 A1* | 6/2018 | Lee ...................... H01L 29/0649 |
| 2019/0103265 A1* | 4/2019 | Kao ................ H01L 21/823468 |
| 2019/0109141 A1* | 4/2019 | Lee ...................... H01L 29/0847 |
| 2020/0027992 A1* | 1/2020 | Jung ................. H01L 29/66484 |

\* cited by examiner

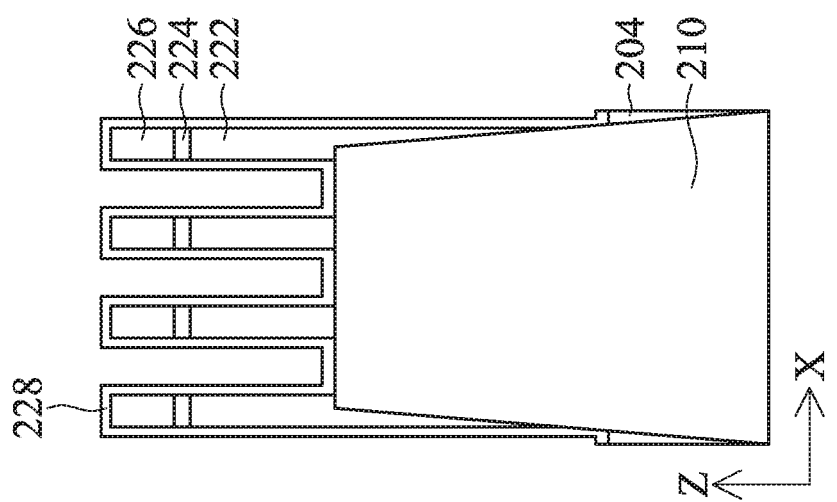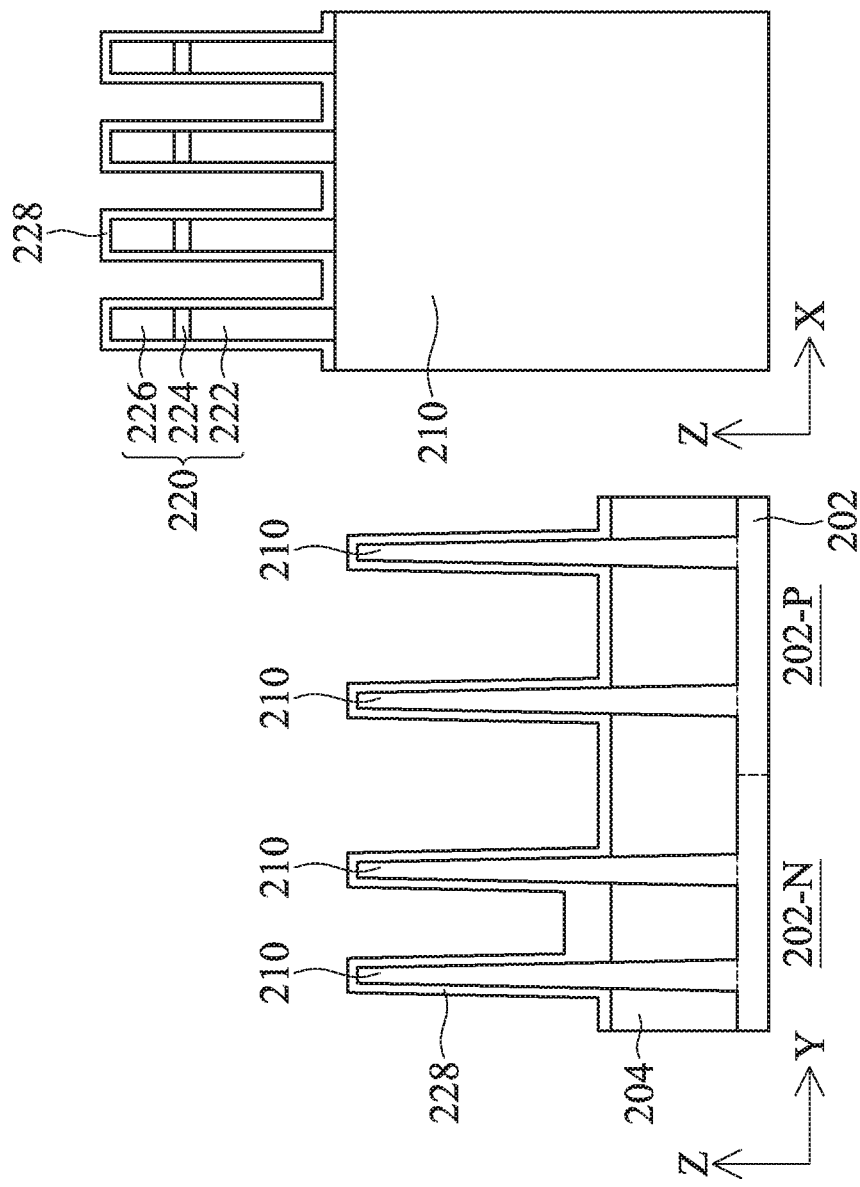
FIG. 3A  FIG. 3B  FIG. 3C

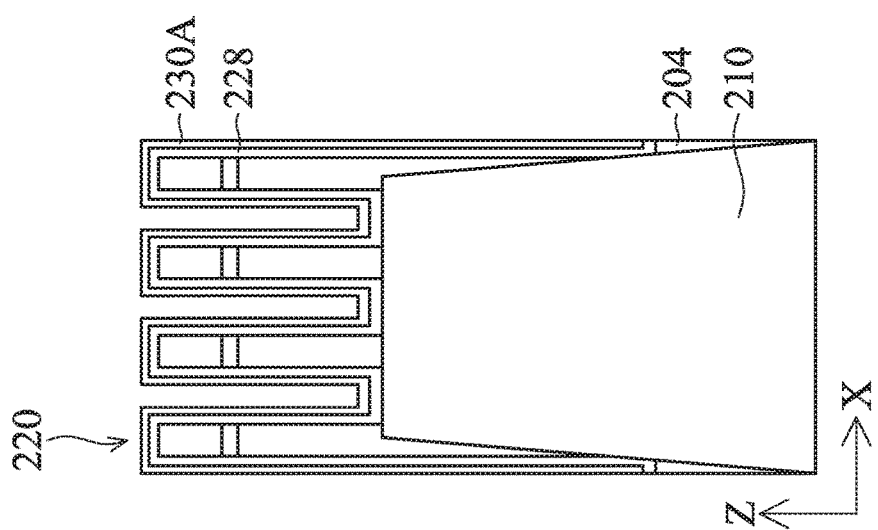
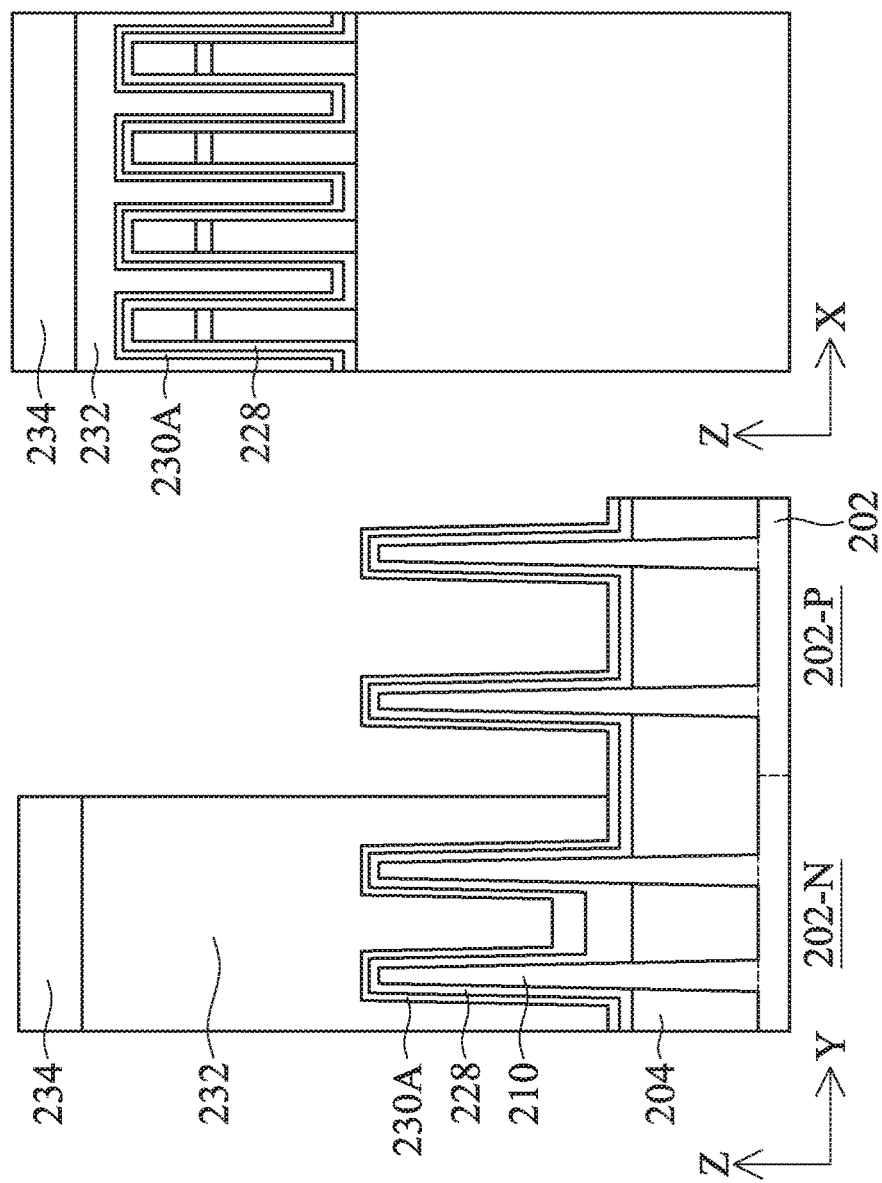
FIG. 5A  FIG. 5B  FIG. 5C

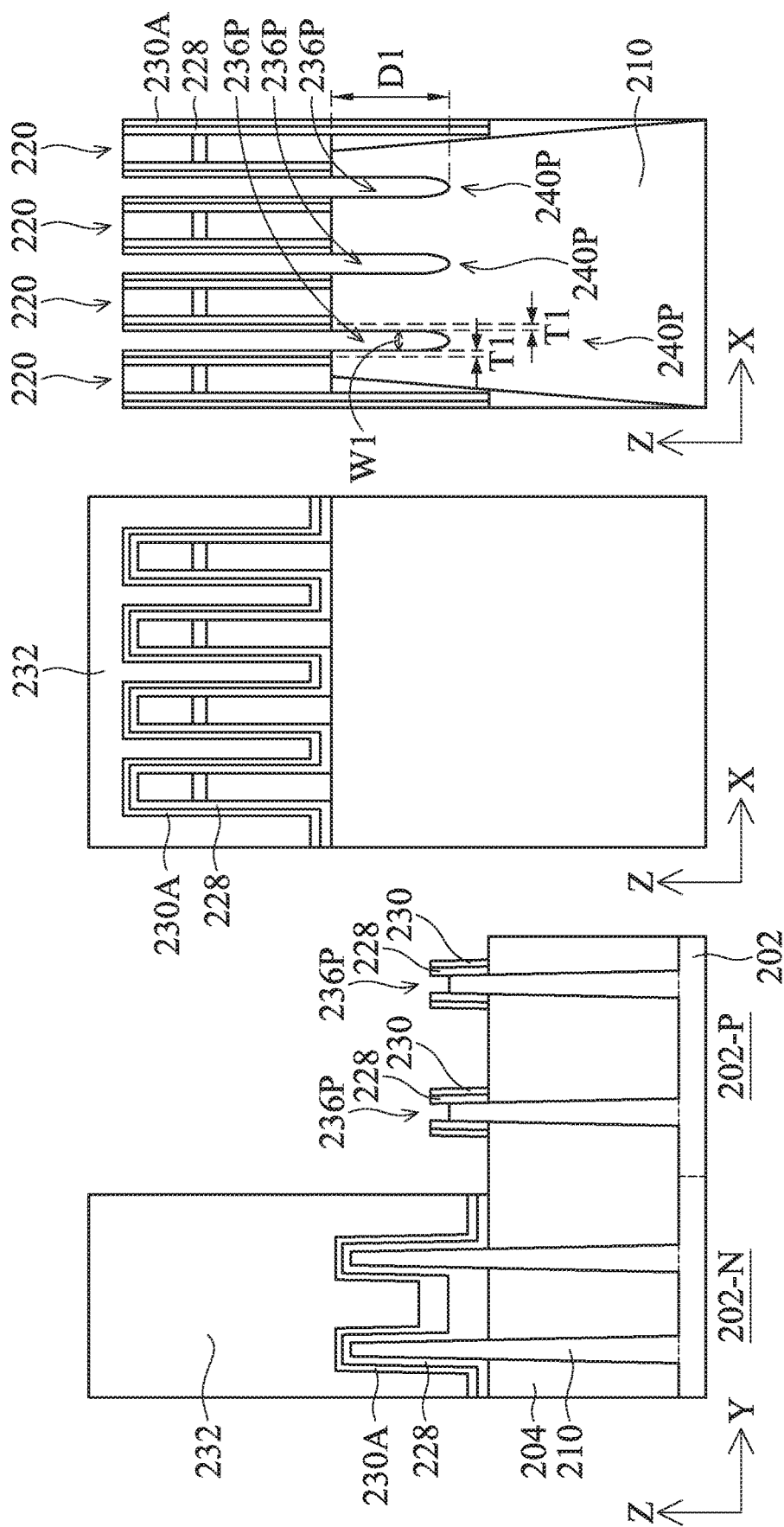

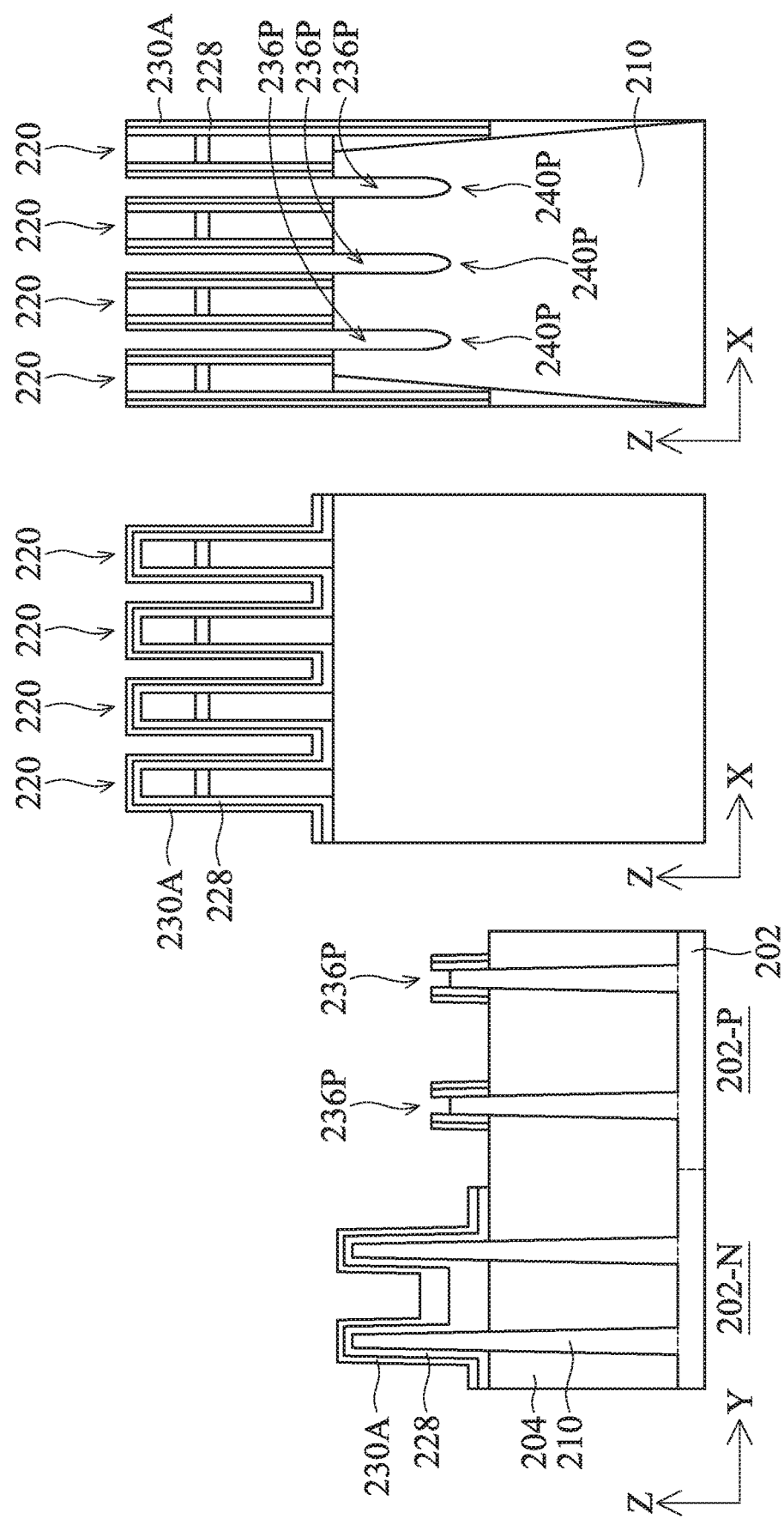

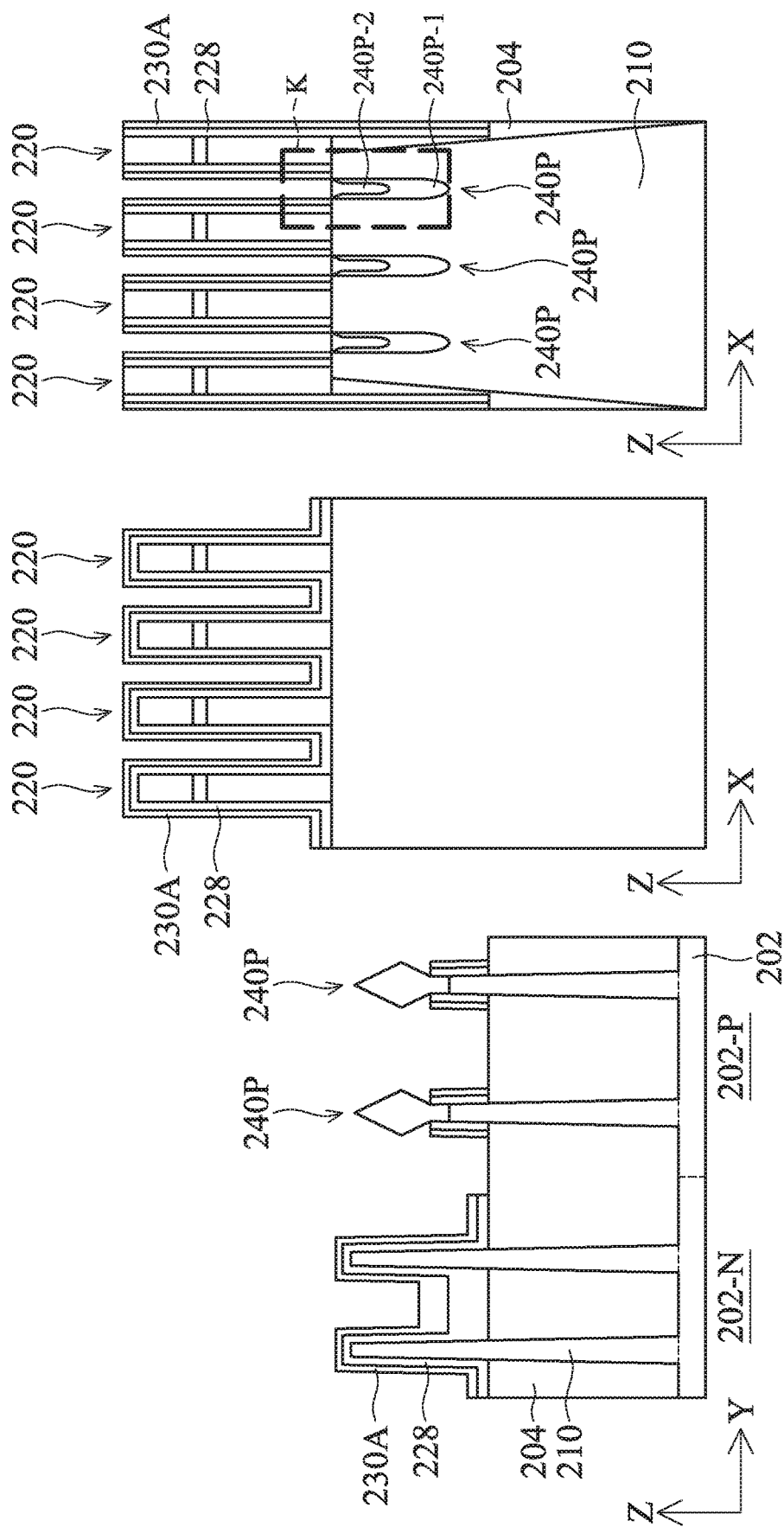

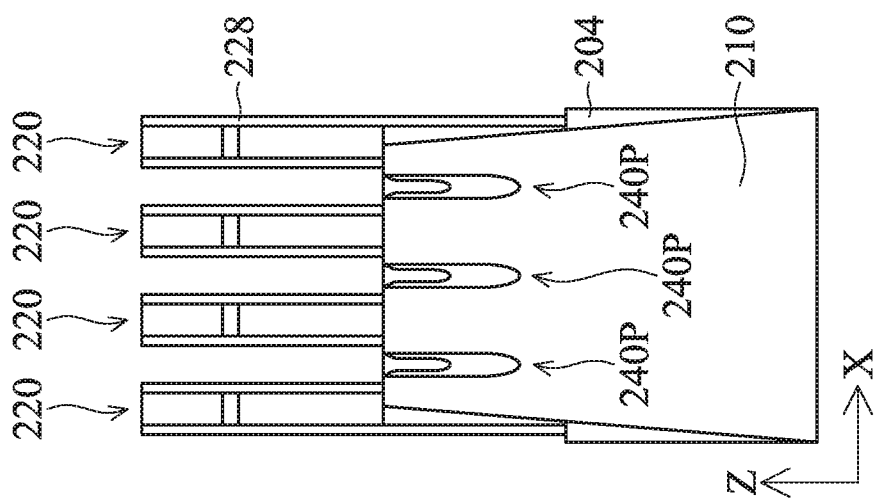
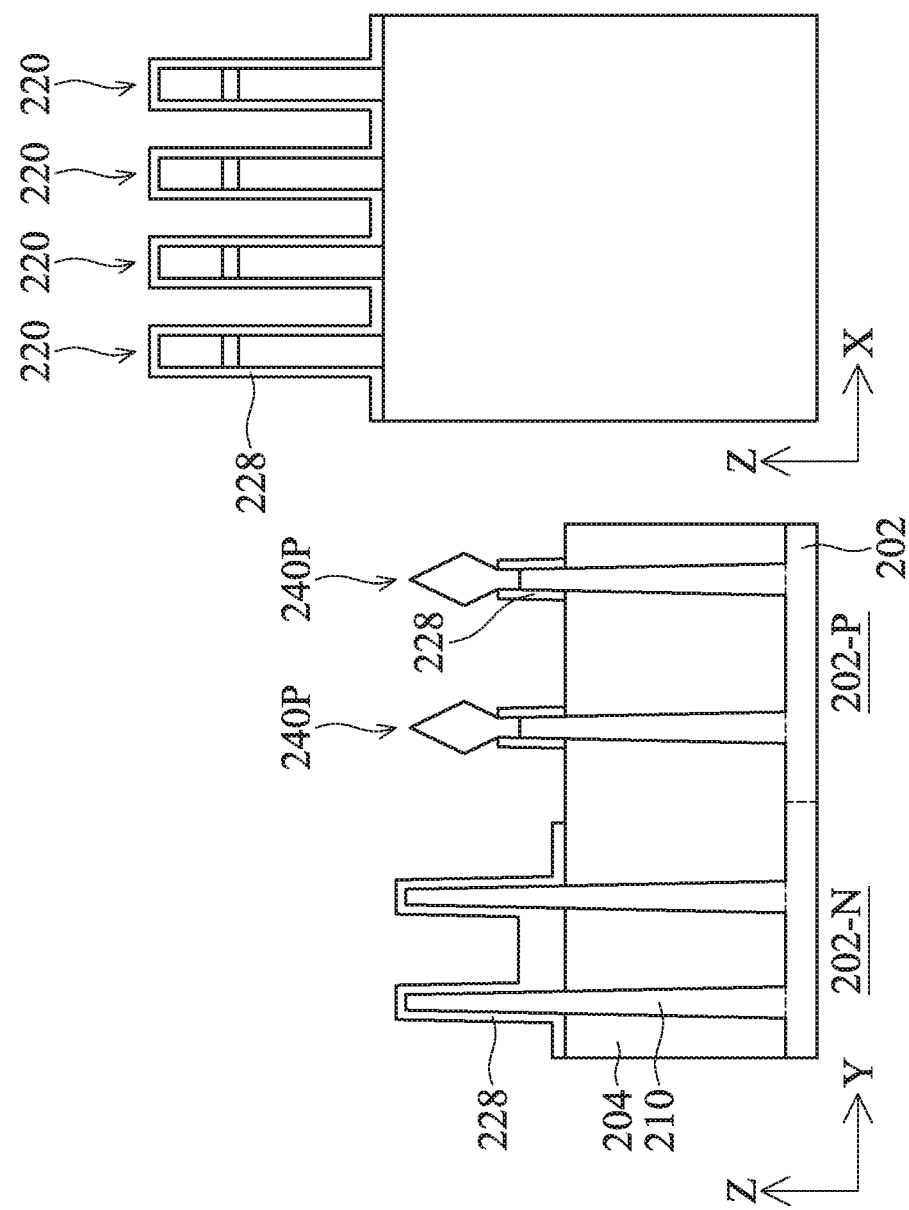

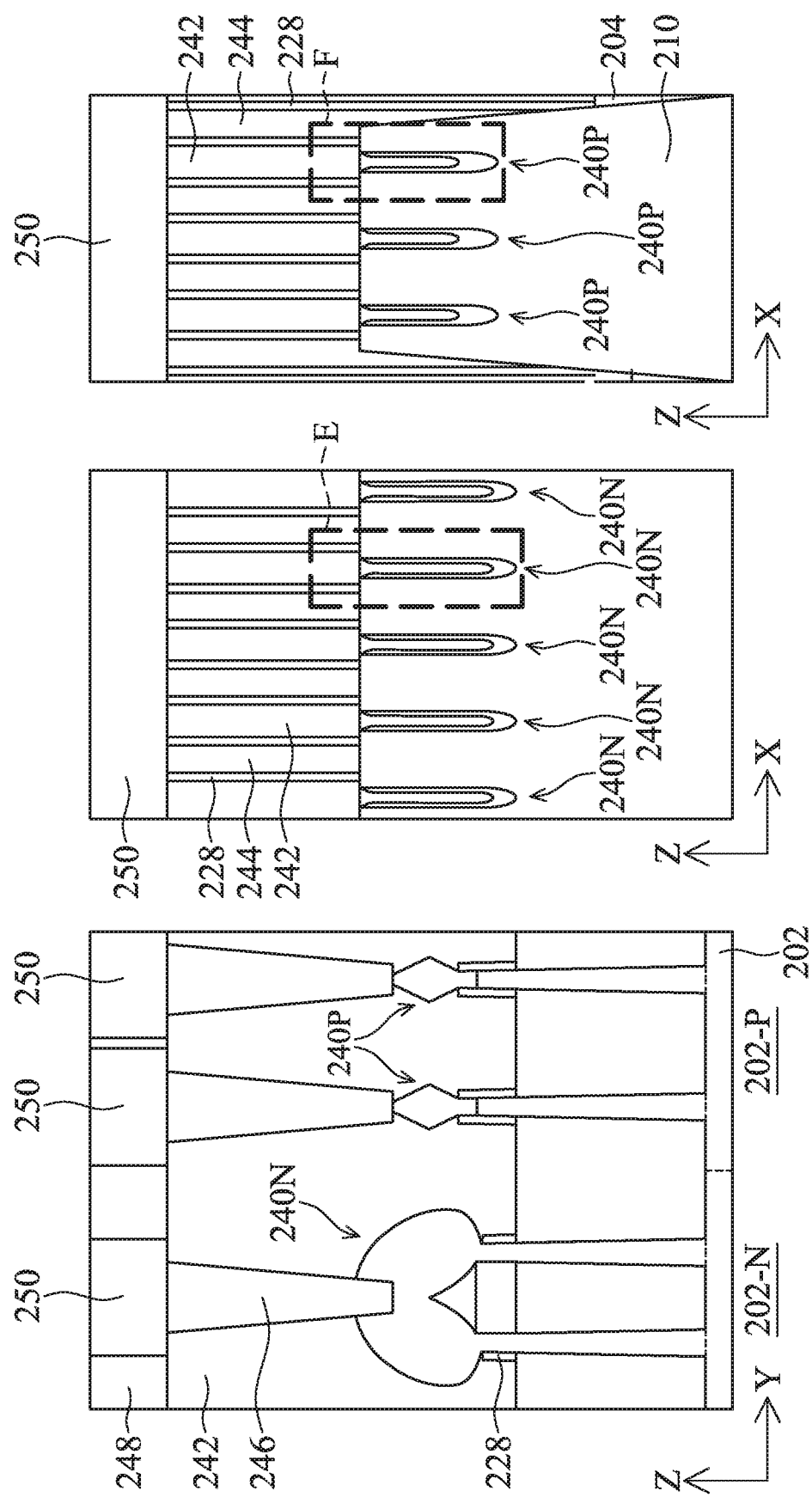

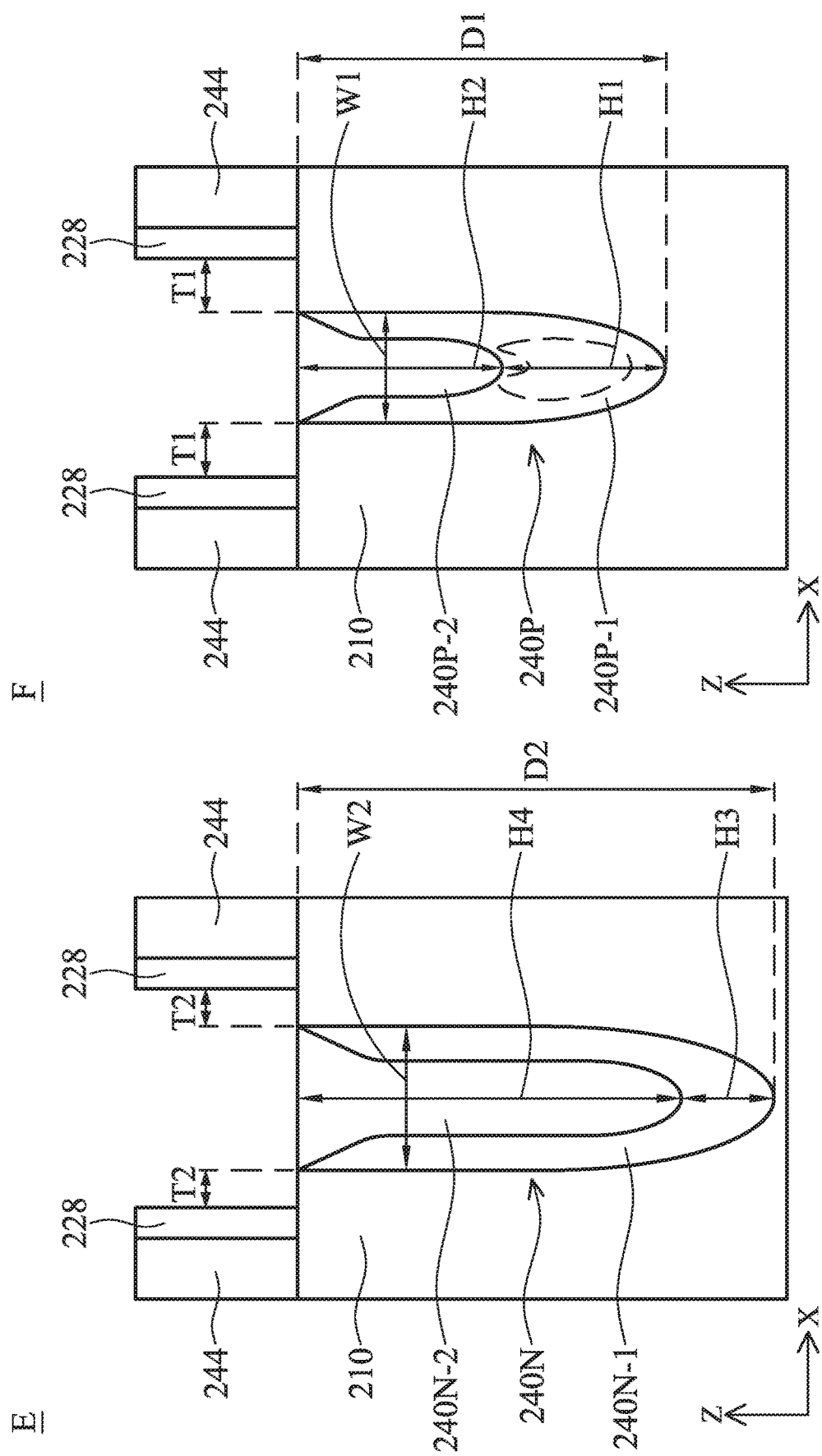

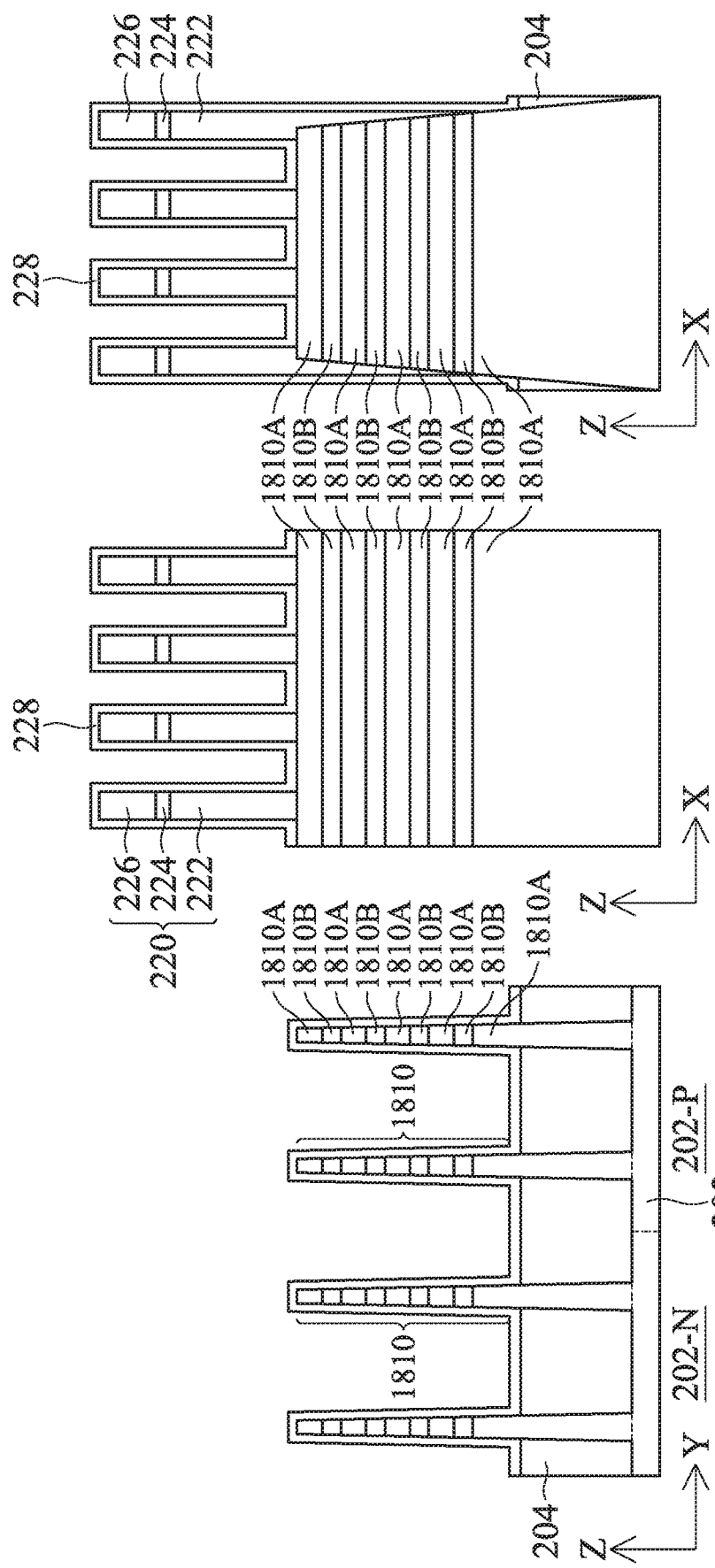

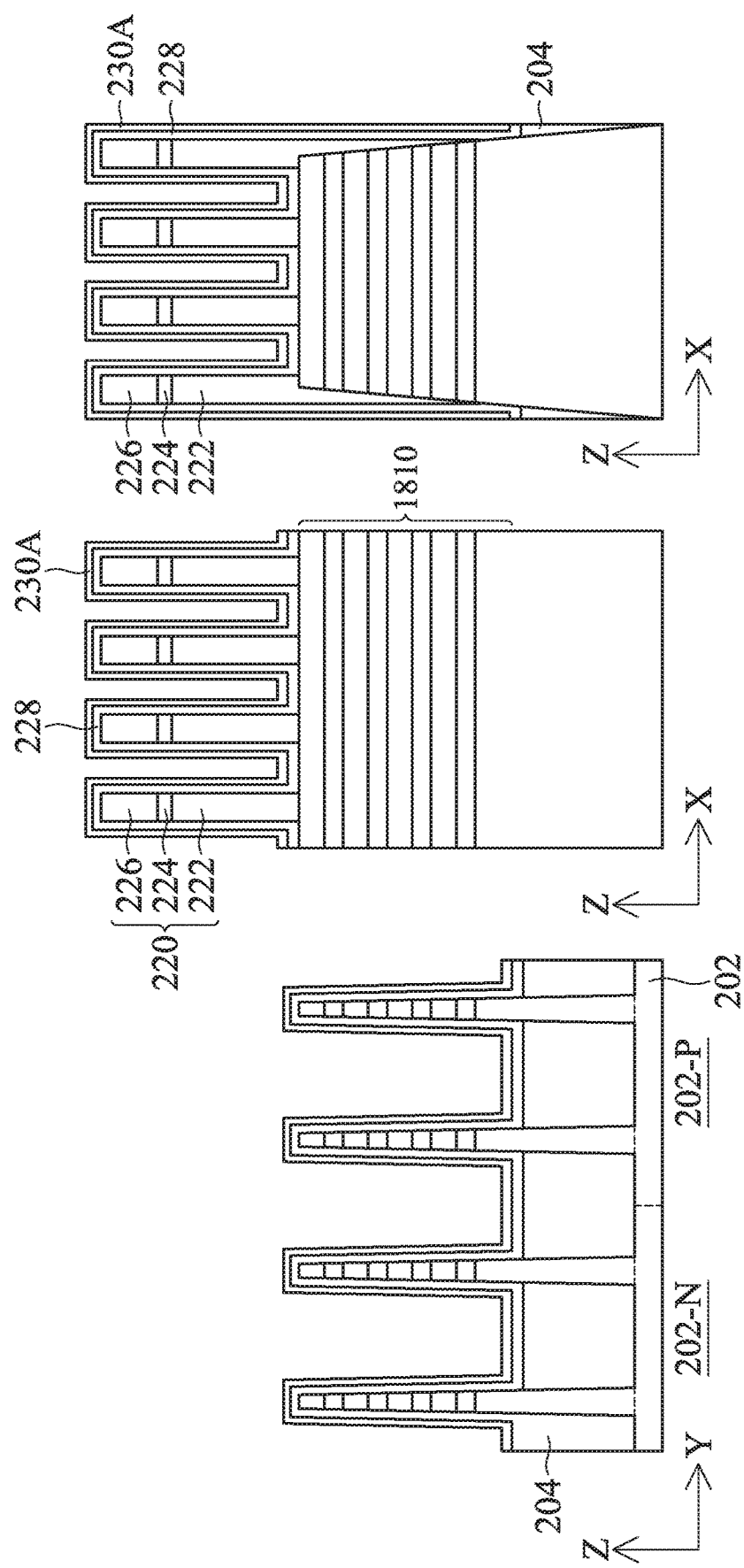

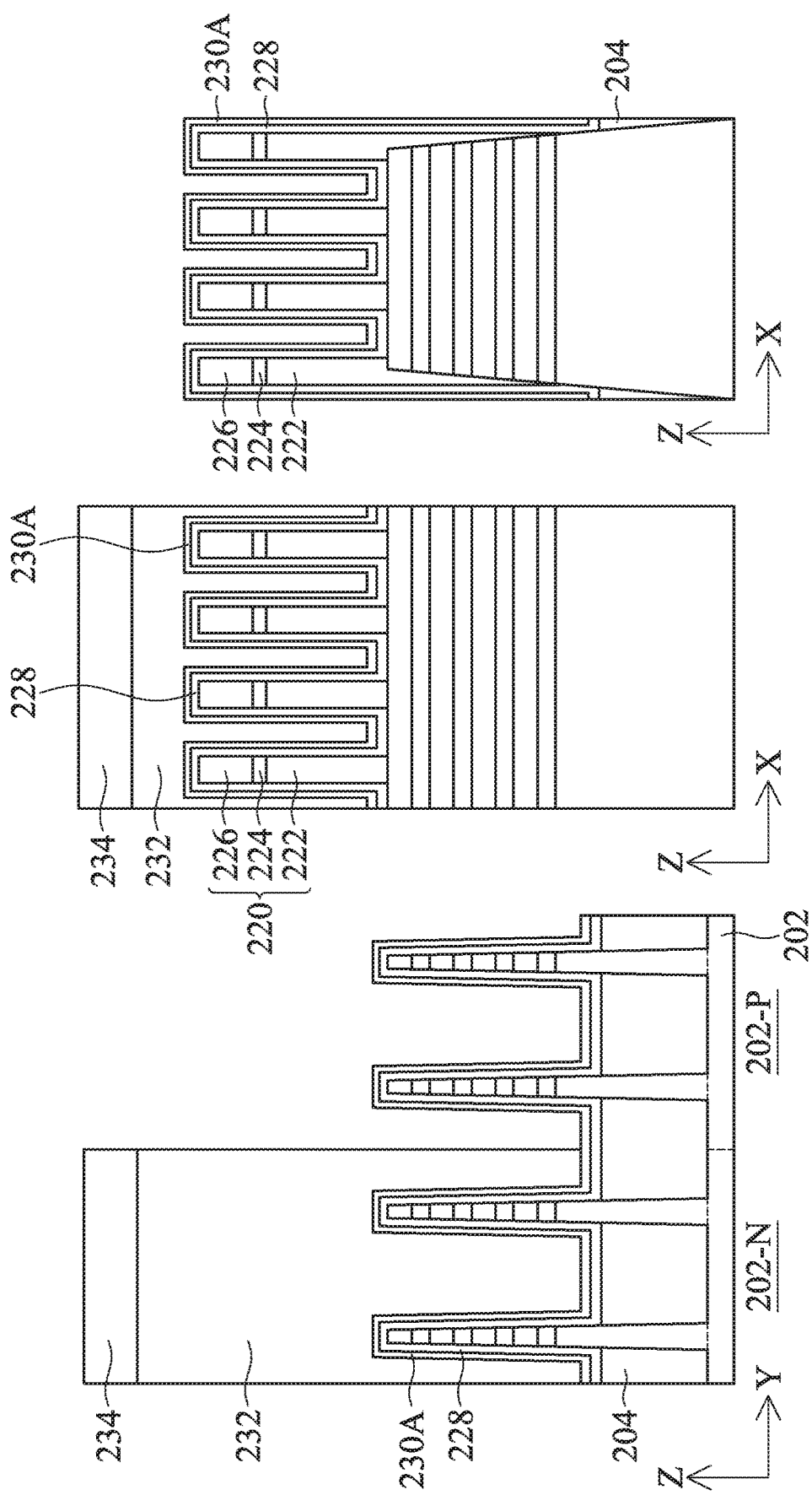

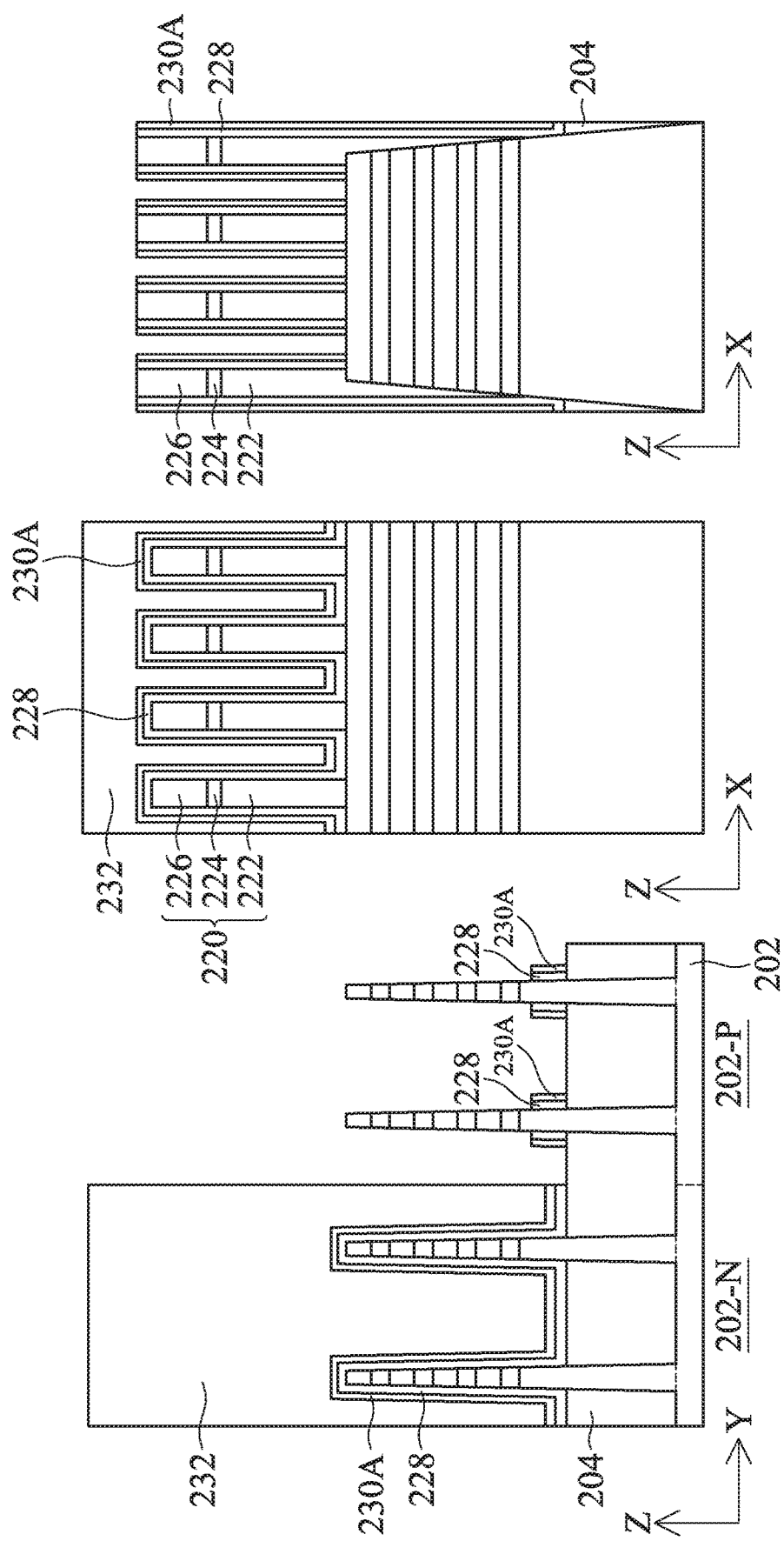

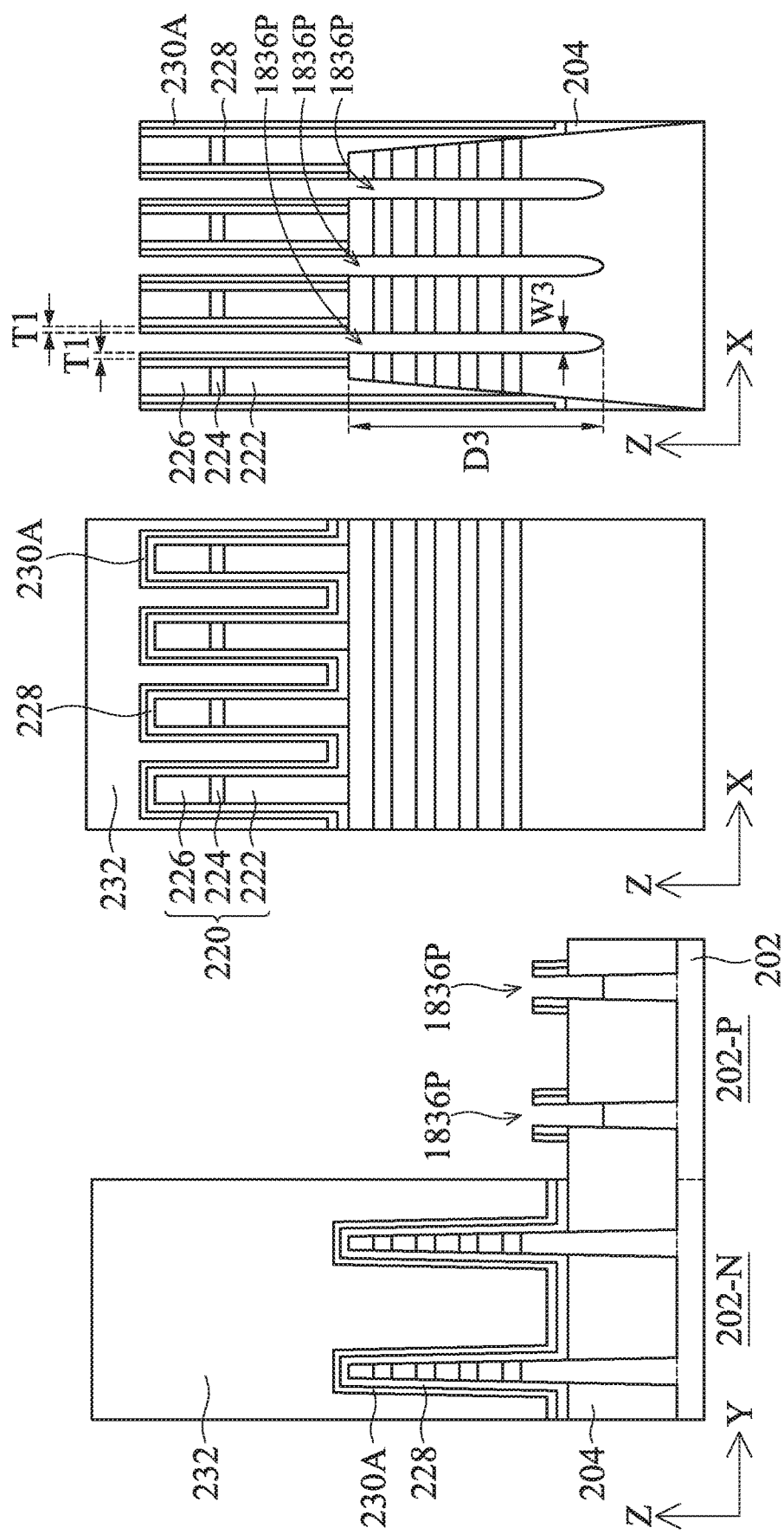

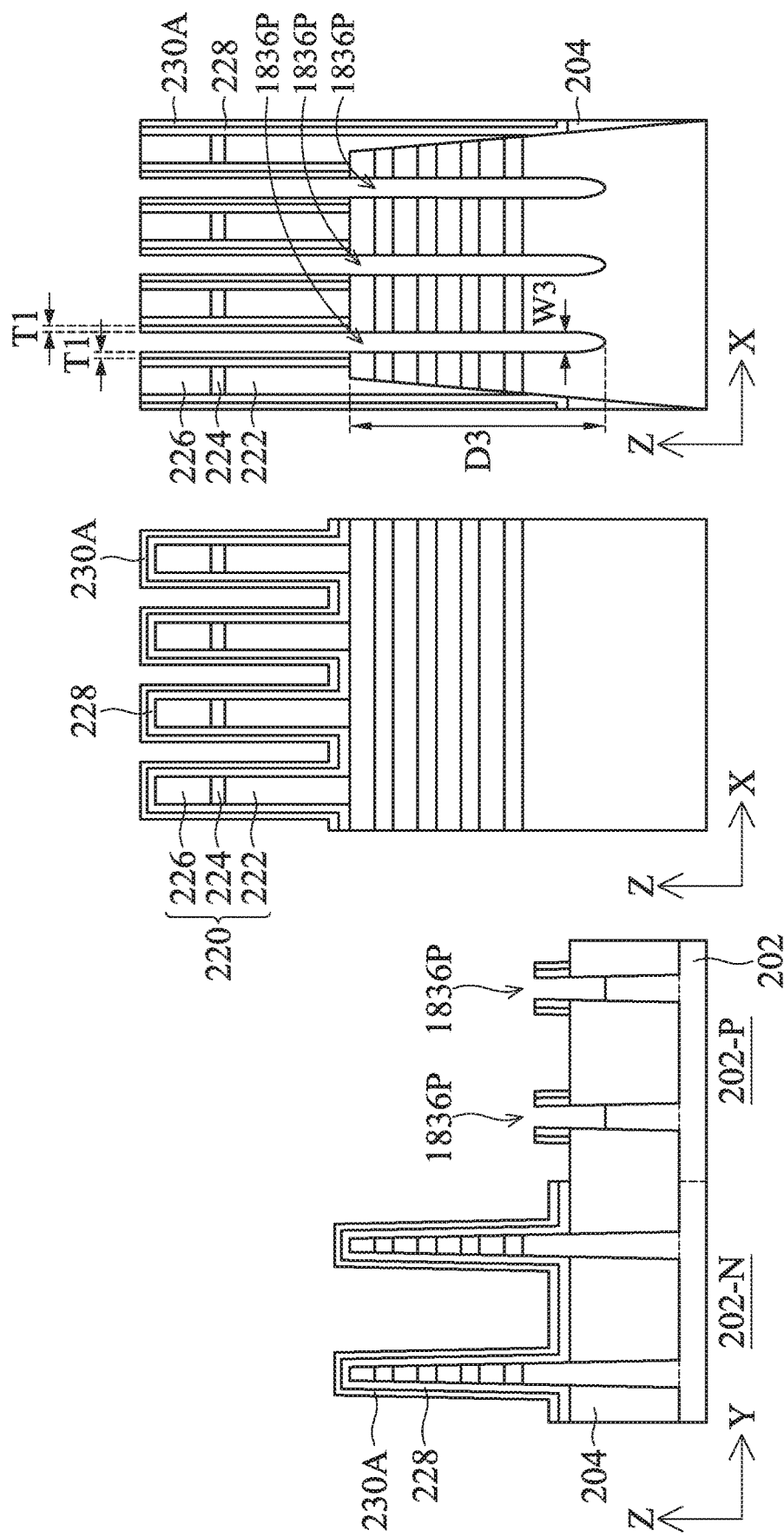

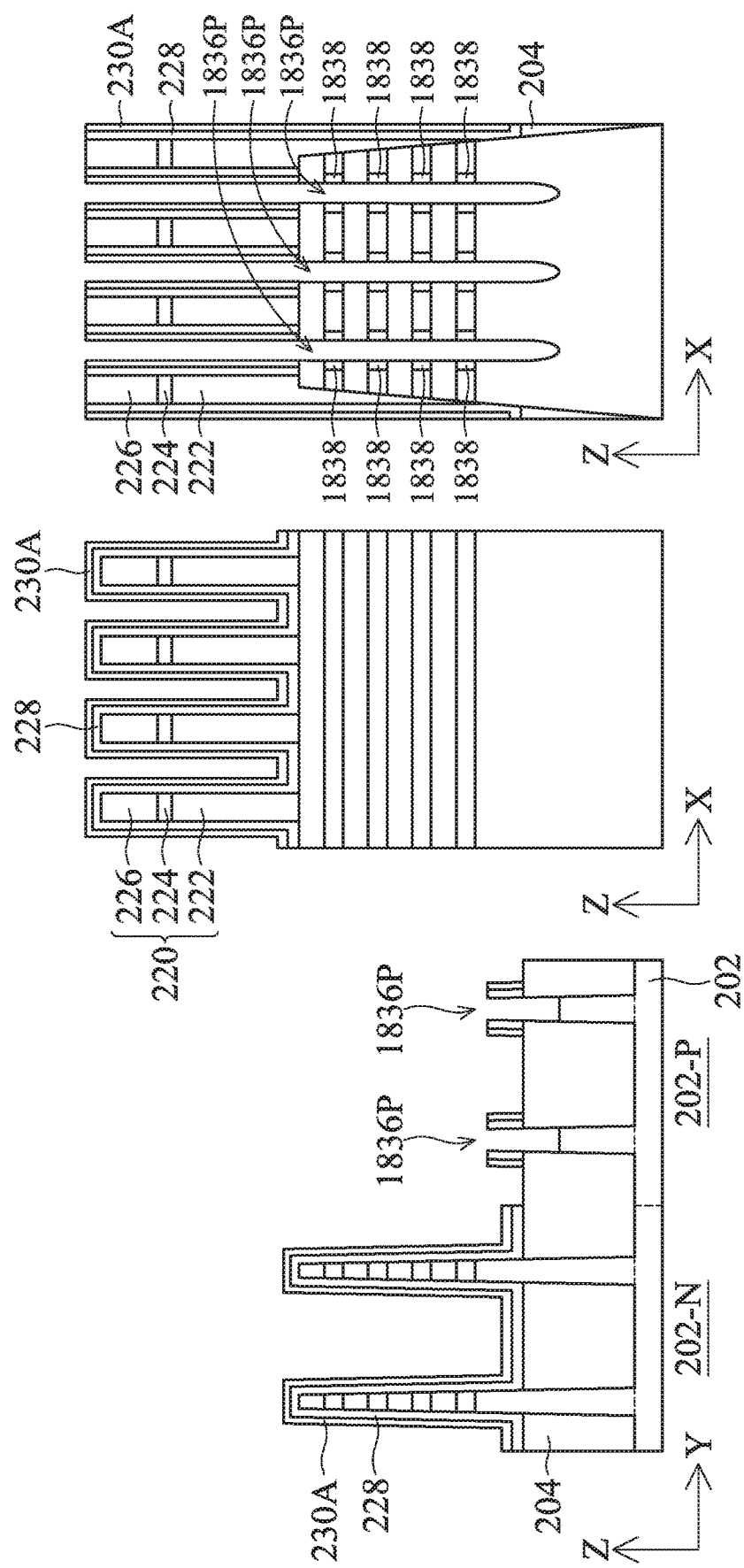

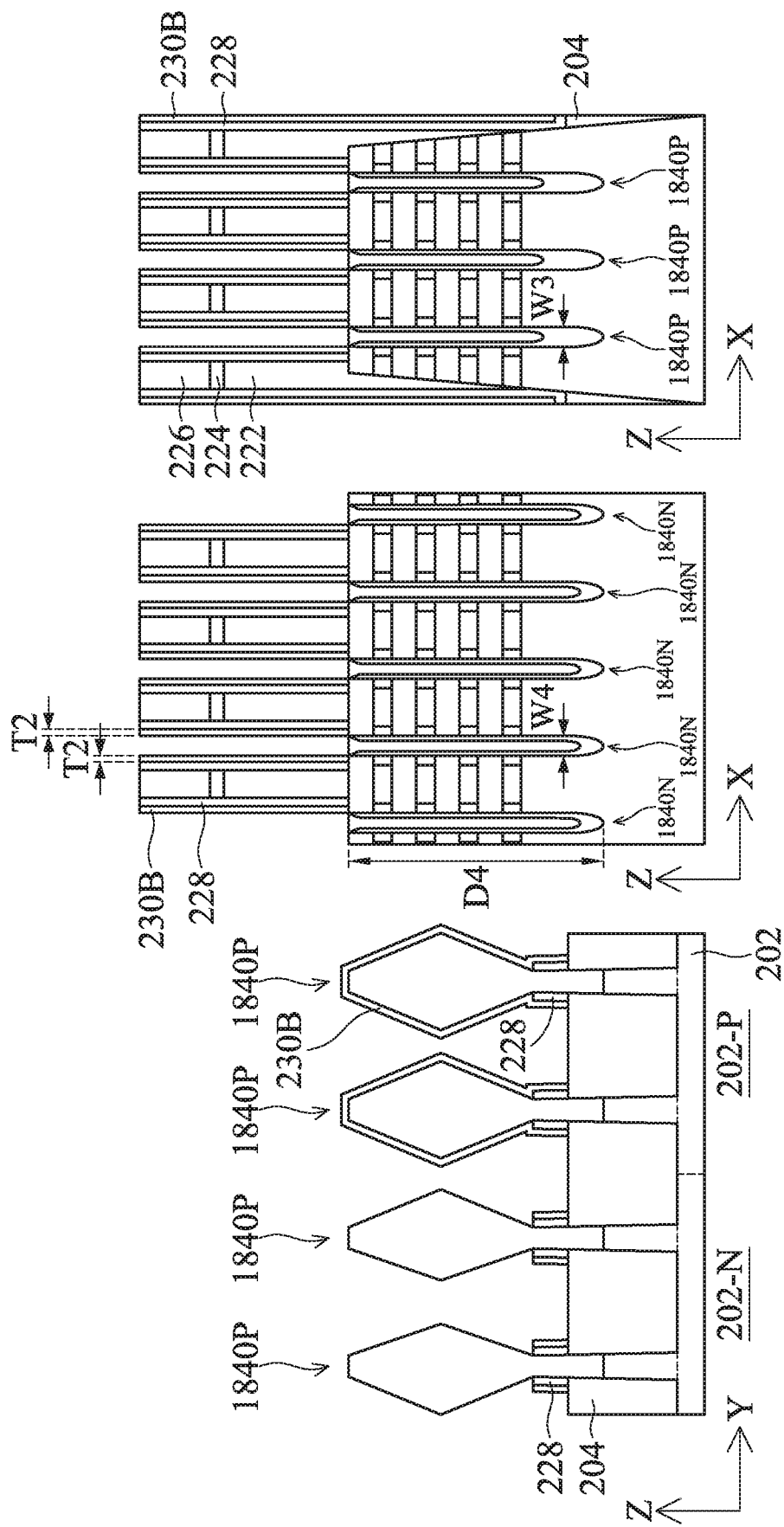

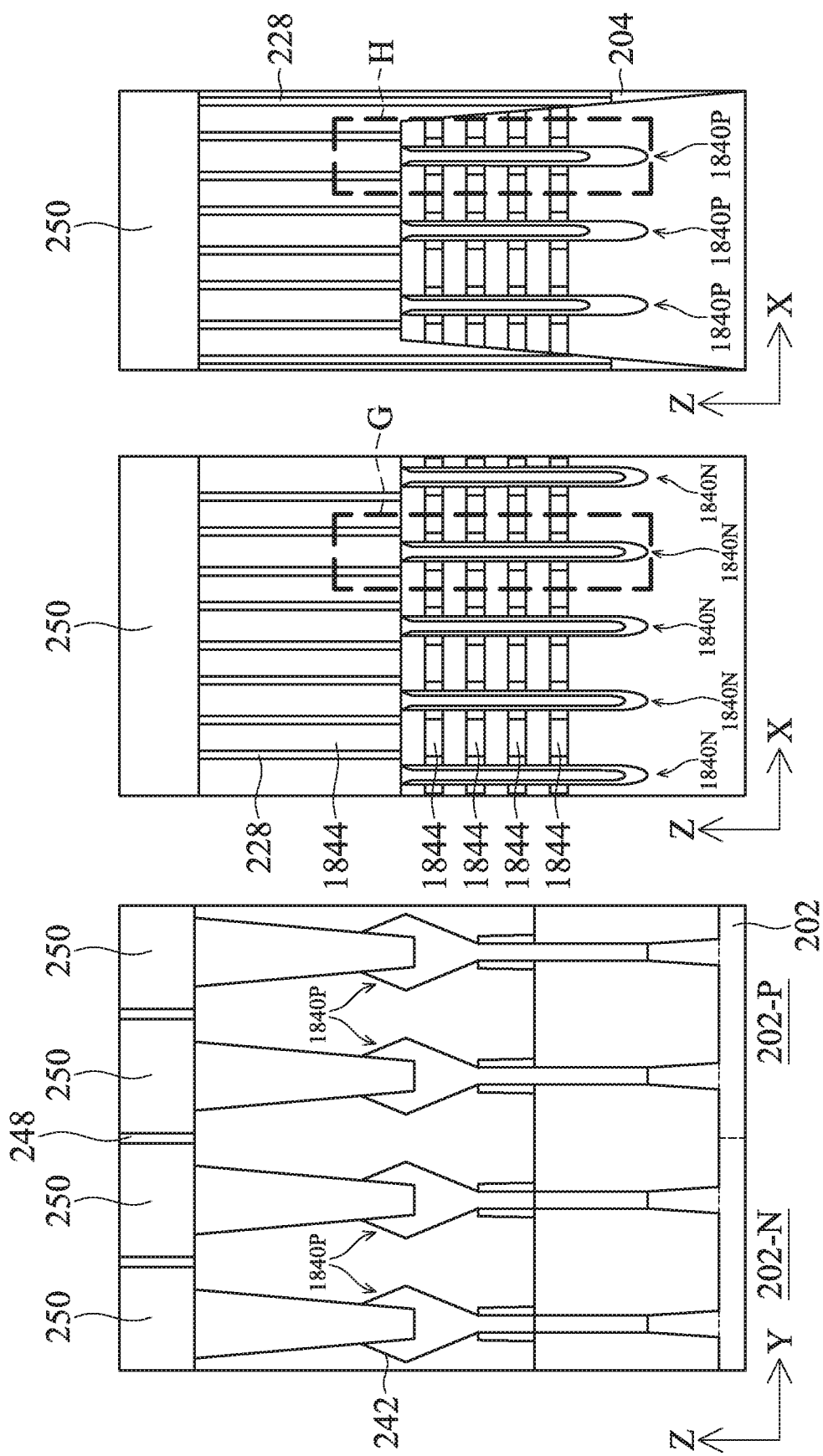

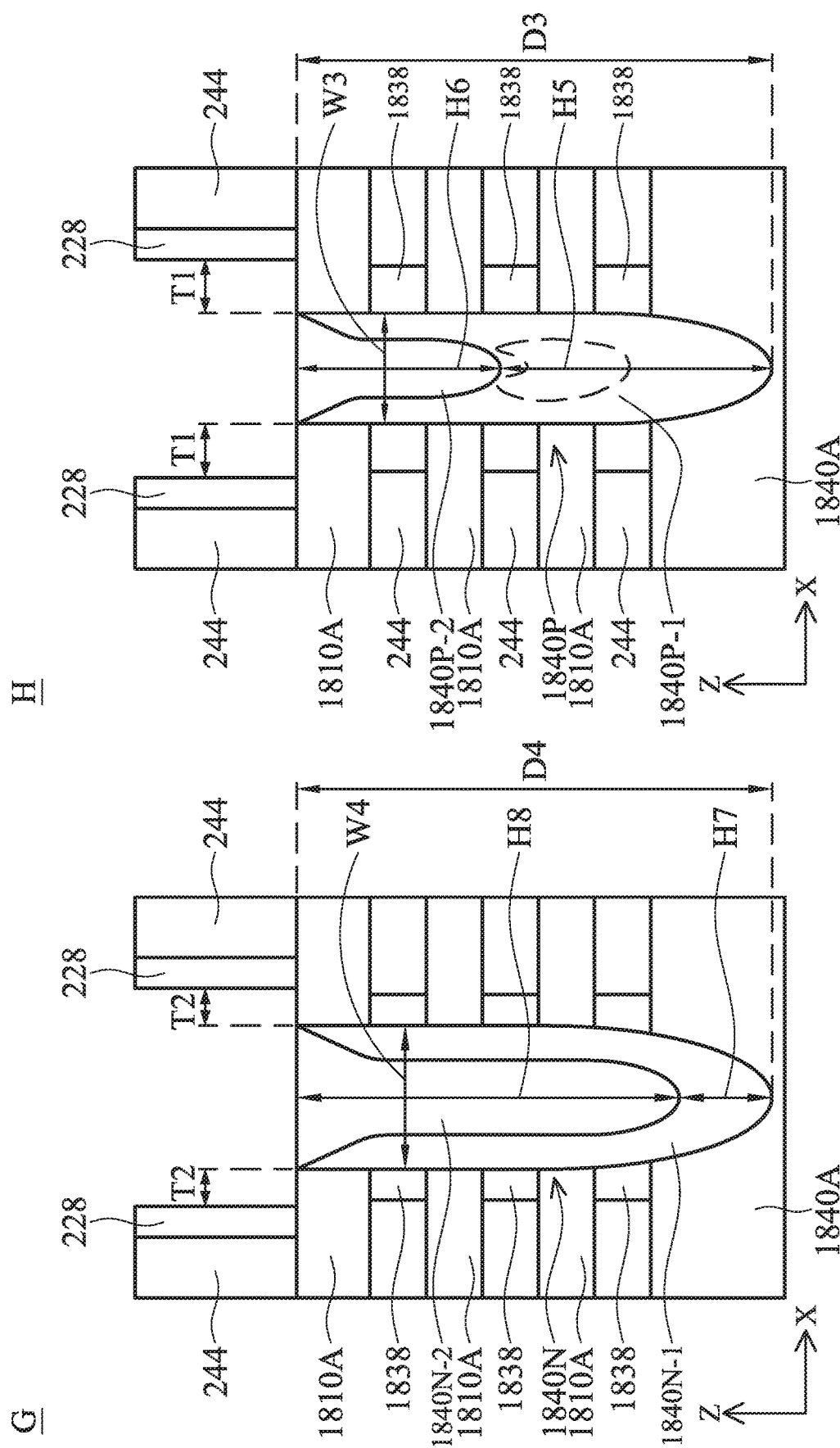

SEMICONDUCTOR DEVICE WITH TUNABLE EPITAXY STRUCTURES AND METHOD OF FORMING THE SAME

This application claims benefits of U.S. Provisional Patent Application Ser. No. 62/907,368, filed Sep. 27, 2019, the entire disclosure of which is incorporated herein by reference.

BACKGROUND

Static Random Access Memory (SRAM) are commonly used in integrated circuits (IC). SRAM have the advantages of holding data without a need for refreshing. An SRAM cell typically includes two p-type pull-up (PU) transistors, two n-type pull-down (PD) transistors, and two n-type pass-gate (PG) transistors. The PD transistors form cross-coupled inverters with the PU transistors. Performance of a SRAM cell can be evaluated by a read/write margin of the SRAM cell. Specifically, reading performance is related to the PD and PG transistors, and the writing performance is related to the PU and PG transistors.

Due to the aggressive scaling down of the IC industry, three-dimensional transistors, such as fin-like field-effect transistor (FinFET) and/or gate-all-around (GAA) transistor, have been introduced into the SRAM fabrication. Although existing FinFET or GAA devices and the fabricating method thereof have been generally adequate for their intended purposes, they have not been entirely satisfactory in all respects. For example, it has been observed that FinFET or GAA SRAM cell suffers from small read/wright margin due to stronger PU performance compared with PD performance. Accordingly, improvements are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 10A, 11A, 12A, 13A, 14A, and 15A illustrate cross-sectional views of the example semiconductor device along line A-A' in FIG. 2 at intermediate stages of the example method of FIG. 1 in accordance with some embodiments of the present disclosure.

FIGS. 3B, 4B, 5B, 6B, 7B, 8B, 10B, 11B, 12B, 13B, 14B, and 15B illustrate cross-sectional views of the example semiconductor device along line B-B' in FIG. 2 at intermediate stages of the example method of FIG. 1 in accordance with some embodiments of the present disclosure.

FIGS. 3C, 4C, 5C, 6C, 7C, 8C, 10C, 11C, 12C, 13C, 14C, and 15C illustrate cross-sectional views of the example semiconductor device along line C-C' in FIG. 2 at intermediate stages of the example method of FIG. 1 in accordance with some embodiments of the present disclosure.

FIGS. 16A and 16B illustrate enlarged views of the blocks E and F in FIGS. 15B and 15C, respectively.

FIGS. 19A, 20A, 21A, 22A, 23A, 24A, 25A, 26A, 27A, 28A, and 29A illustrate cross-sectional views of the other example semiconductor device along line A-A' in FIG. 18 at intermediate stages of the example method of FIG. 17 in accordance with some other embodiments of the present disclosure.

FIGS. 19B, 20B, 21B, 22B, 23B, 24B, 25B, 26B, 27B, 28B, and 29B illustrate cross-sectional views of the other example semiconductor device along line B-B' in FIG. 18 at intermediate stages of the example method of FIG. 17 in accordance with some other embodiments of the present disclosure.

FIGS. 19C, 20C, 21C, 22C, 23C, 24C, 25C, 26C, 27C, 28C, and 29C illustrate cross-sectional views of the other example semiconductor device along line C-C' in FIG. 18 at intermediate stages of the example method of FIG. 17 in accordance with some other embodiments of the present disclosure.

FIGS. 30A and 30B illustrate enlarged views of the blocks G and H in FIGS. 29B and 29C, respectively.

DETAILED DESCRIPTION

Figure 1:
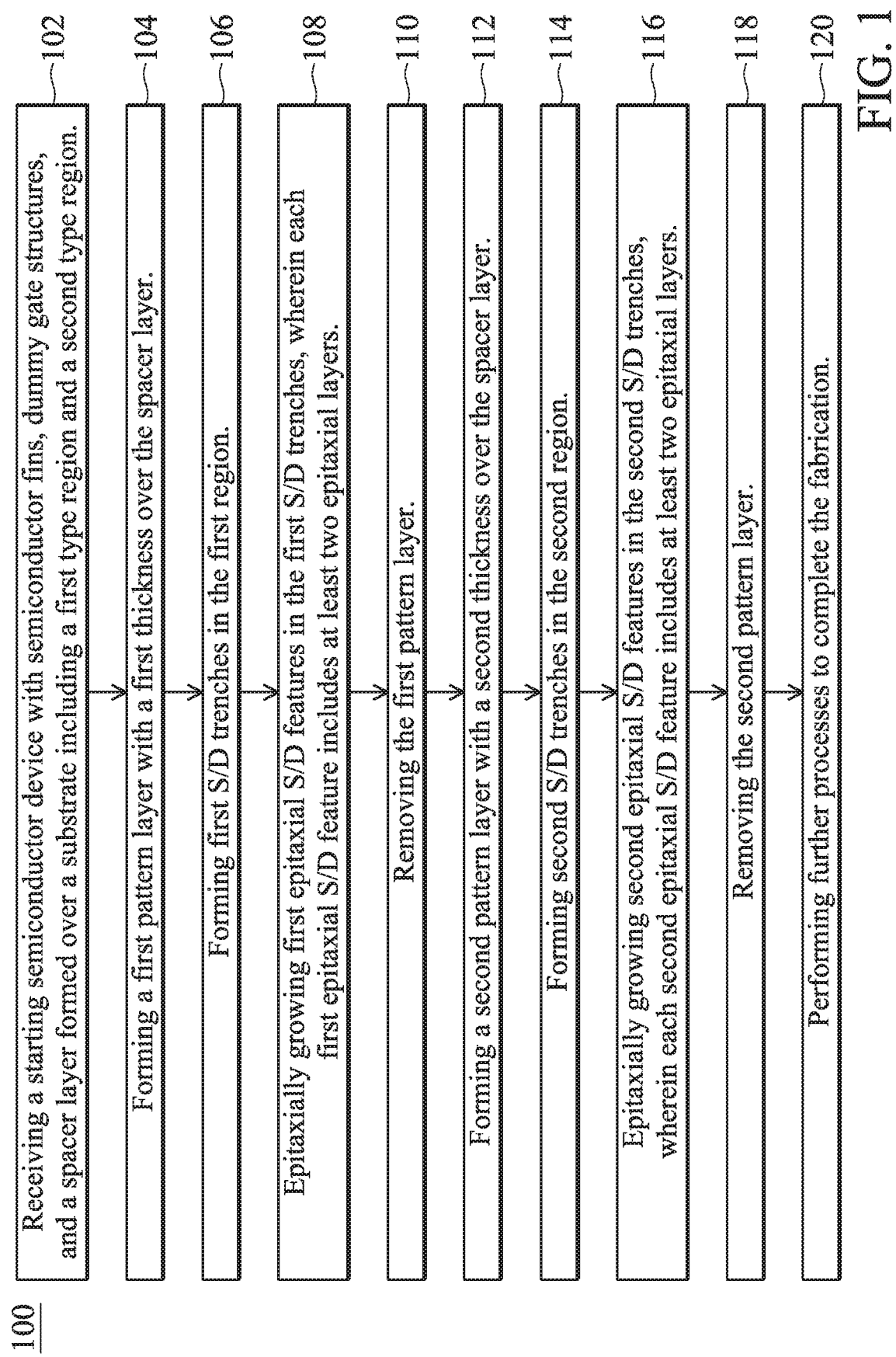
FIG. 1 illustrates a flowchart of an example method for making an example semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating semiconductor devices with tunable epitaxy structures.

One three-dimensional semiconductor device that has been introduced is the FinFET. The FinFET gets its name from the fin-like structure which extends from a substrate, and which is used to form the field-effect transistor (FET) channel. Another example of the three-dimensional semiconductor device is called a gate-all-around (GAA) device, whose channel structure includes multiple semiconductor channel layers, and the gate structure extends around the channel layers and provides access to the channel region on all sides. Both FinFET and GAA transistors are used for SRAM manufacturing. Some SRAM cells suffer from poor writing performance because their PU performance and PD performance are unbalanced. Particularly, their PU transistors outperform their PD transistors. The PU transistors of the SRAM are p-type transistors (for example, p-type FinFETs or p-type GAA transistors), and the performance of the p-type transistors is generally related to the thickness of highly doped epitaxial source/drain (S/D) features. Therefore, reducing the thickness of highly doped epitaxial S/D features will weaken the performance of the PU transistors and improve the read/write margin of the SRAM.

In some embodiments of the present disclosure, a pattern layer is used as a push-in mask to tune the width of S/D trenches, thereby tuning the thickness of multiple epitaxial S/D layers grown in the S/D trenches. For example, the greater the thickness of the pattern layer, the greater the push-in extent of the S/D trenches, and the smaller the width of the S/D trench. Here, the push-in extent of the S/D trenches is defined as a distance between a sidewall of the S/D trench to the closest sidewall of a spacer layer. Further, the multiple epitaxial S/D layers can be tuned to have different dopant concentrations and different thicknesses among the different layers. All of these contribute to tuning the performance of an SRAM (read/write margin).

FIG. 1 illustrates a flow chart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional view and cross-sectional views of the device 200 during intermediate steps of method 100.

Figure 2:
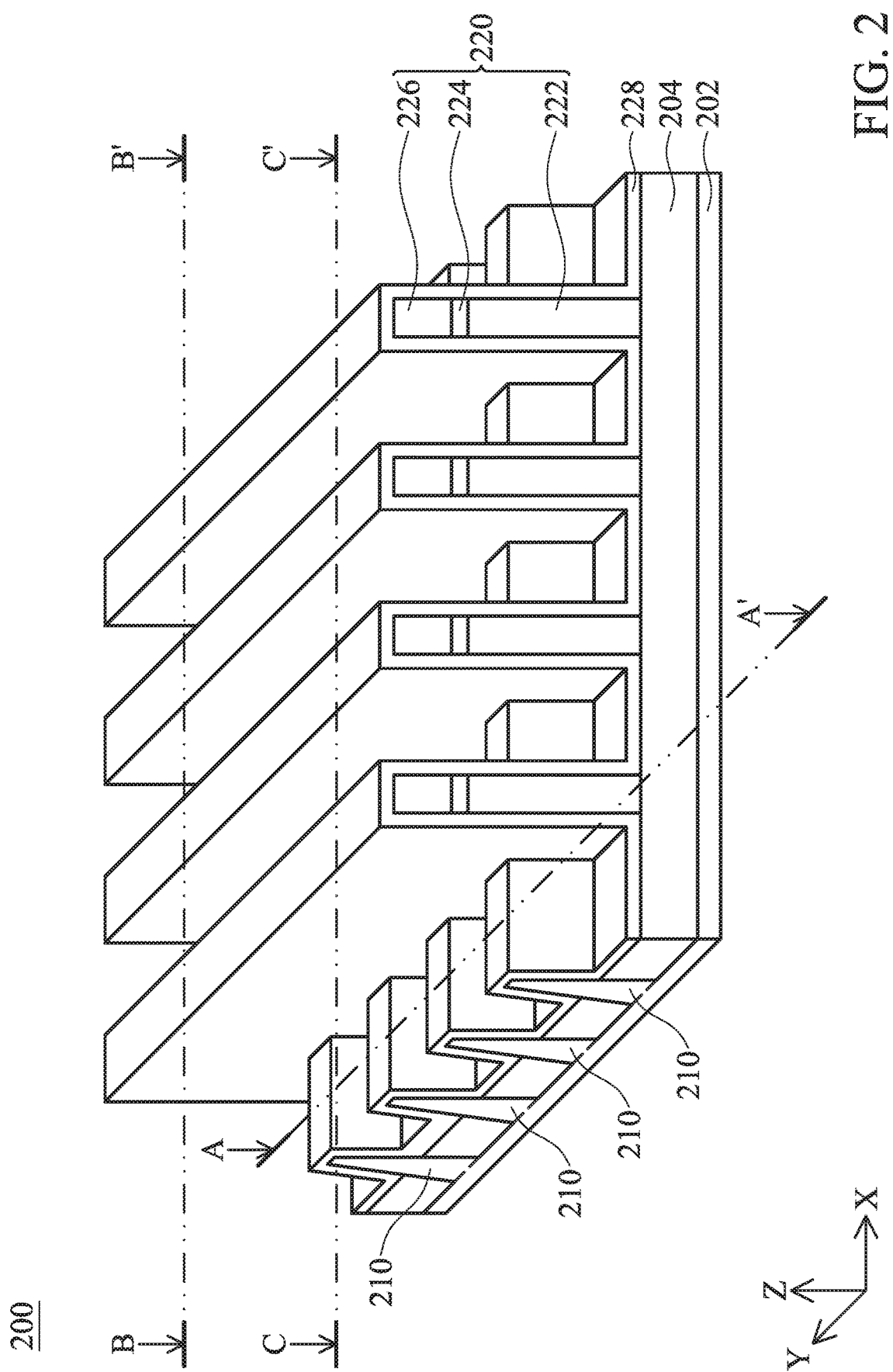
FIG. 2 illustrates a three-dimensional view of the example semiconductor device in accordance with some embodiments of the present disclosure.
Figure 4C:
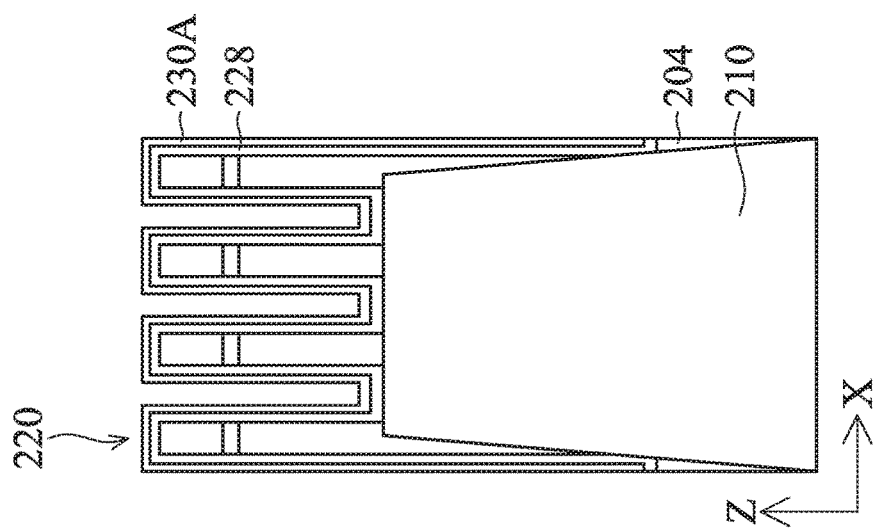
Figure 4B:
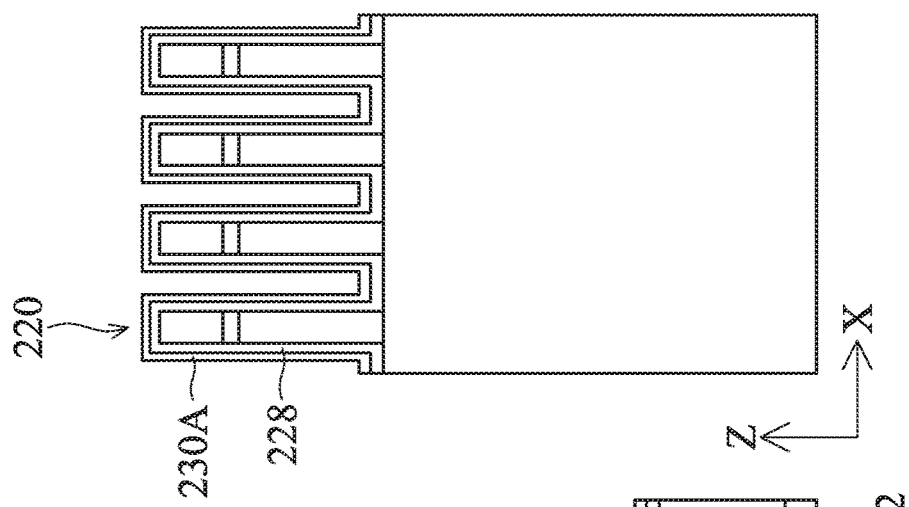
Figure 4A:
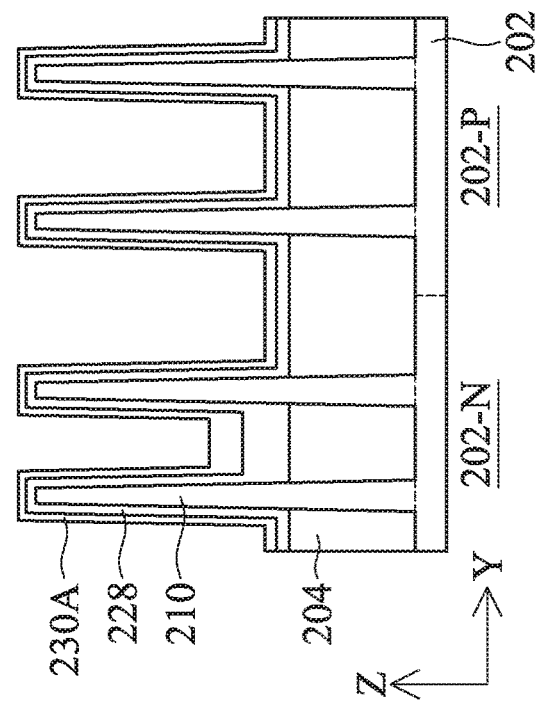
Figure 9B:
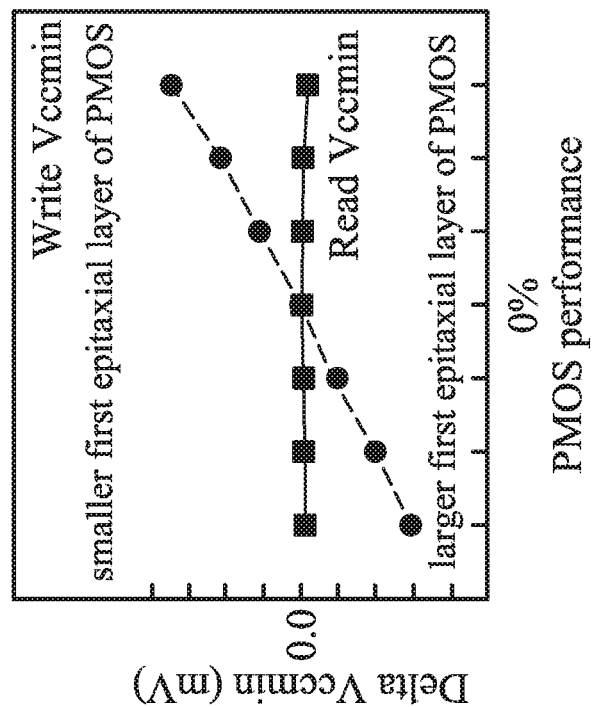
FIG. 9B illustrates a diagram showing the relationship between PMOS performance, the delta Vccmin (minimum supply voltage) and the size of the first epitaxial layer of the PMOS.
Figure 9A:
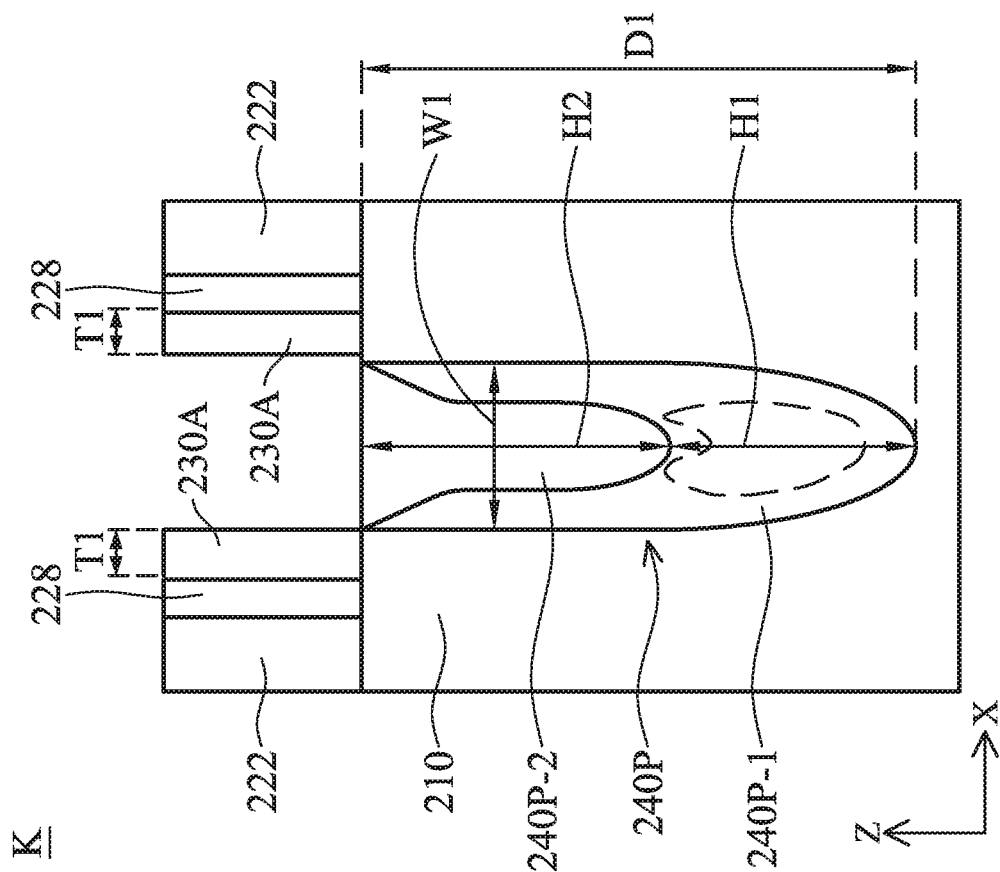
FIG. 9A illustrates an enlarged view of the block X in FIG. 8C.

FIG. 2 illustrates a three-dimensional view of a starting device 200 in accordance with some embodiments of the present disclosure; FIGS. 3A-8A and 10A-15A illustrate cross-sectional views of device 200 taken along line A-A' in FIG. 2 (that is, in an y-z plane); FIGS. 3B-8B and 10B-15B illustrate cross-sectional views of device 200 taken along line B-B' in FIG. 2 (that is, in an x-z plane); and FIGS. 3C-8C and 10C-15C illustrate cross-sectional views of device 200 taken along line C-C' in FIG. 2 (that is, in an x-z plane). FIG. 9A illustrates enlarged view of block X in FIG. 8C; and FIGS. 16A and 16B illustrate enlarged view of blocks E and F in FIGS. 15B and 15C, respectively. Device 200 generally refers to any fin-based device, which can be included in a microprocessor, a memory cell, and/or other IC device. In some implementations, device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In the depicted embodiment, the device 200 includes a portion of an SRAM cell. FIGS. 2, 3A-16C have been simplified for the sake of clarity to better understand the inventive concepts of the present disclosure. Additional features can be added in device 200, and some of the features described below can be replaced, modified, or eliminated in other embodiments of device 200.

Referring to FIGS. 1, 2, and 3A-3C, at operation 102, the starting device 200 is received. The device 200 includes a substrate 202. In the depicted embodiment, the substrate 202 is a bulk silicon substrate. Alternatively or additionally, the substrate 202 includes another single crystalline semiconductor, such as germanium; a compound semiconductor; an alloy semiconductor; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may be doped with different dopants to form various doped regions therein. For example, the substrate 202 may include PFET region 202-P configured for p-type metal-oxide-semiconductor (MOS) FETs (PFET) (for example, PFET region 202-P may include n-type doped substrate regions such as n-well)) and NFET region 202-N configured for n-type MOS FETs (NFET) (for example, NFET region 202-N may include p-type doped substrate regions such as p-well).

The device 200 also includes semiconductor fins 210 (hereinafter, fins 210) protruding from the substrate 202 in the PFET region 202-P and the NFET region 202-N, respectively. The fins 210 are oriented lengthwise substantially parallel to one another. Each of the fins 210 has at least one channel region and at least one source region and at least one drain region defined along their length in the x-direction, where the at least one channel region is covered by the gate stacks 220 and is disposed between the source region and the drain region (both referred to as S/D regions). In some embodiments, the fins 210 are a portion of the substrate 202 (such as a portion of a material layer of the substrate 202). For example, in the depicted embodiment, where the substrate 202 includes silicon, the fins 210 include silicon and are formed by etching the substrate 202. Alternatively, in some embodiments, the fins 210 are defined in a material layer, such as one or more semiconductor material layers, overlying the substrate 202. For example, the fins 210 can include a semiconductor layer stack having various semiconductor layers (such as a heterostructure) disposed over the substrate 202 (as illustrated in FIGS. 18A-18C to 30A-30C, which will be discussed later).

The fins 210 are formed by any suitable process including various deposition, photolithography, and/or etching processes. For example, a patterned masking element is formed over the substrate 202 by a photolithography process. The masking element is then used to etch the fin structure into the substrate 202. Areas not protected by the masking element are etched using reactive ion etching (RIE) processes and/or other suitable processes. In some embodiments, the fins 210 are formed by patterning and etching a portion of the substrate 202. In some other embodiments, the fins 210 are formed by patterning and etching a silicon layer deposited overlying an insulator layer (for example, an upper silicon layer of a silicon-insulator-silicon stack of an SOI substrate). As an alternative to traditional photolithography, the fins 210 can be formed by a double-patterning lithography (DPL) process. It is understood that multiple parallel fins 210 may be formed in a similar manner.

Device 200 also includes an isolation structure 204 disposed over substrate 202. Isolation structure 204 electrically isolates active and/or passive device regions of device 200. Isolation structure 204 can be configured as different structures, such as a shallow trench isolation (STI) structure, a deep trench isolation (DTI) structure, a local oxidation of silicon (LOCOS) structure, or combinations thereof. Isolation structure 204 includes an isolation material, such as silicon dioxide ($SiO_2$), silicon nitride ($Si_3N_4$), silicon oxynitride (SiON), other suitable isolation material (for example, including silicon, oxygen, nitrogen, carbon, and/or other suitable isolation constituent), or combinations thereof. The isolation structure 204 is formed by depositing a dielectric isolation layer and then performing an etch back process such that the isolation structure 204 only surrounds the bottom portions of the fins 210 to isolate the device regions of the device 200.

The device 200 also includes one or more dummy gate structures 220 disposed over the fins 210 and the substrate 202. Each dummy gate structure 220 serves as a placeholder for subsequently forming a metal gate structure. The dummy gate structures 220 engage the respective channel regions of semiconductor fins 210, such that current can flow between the respective S/D regions of semiconductor fins 210 during operation. As depicted in FIG. 2, the dummy gate structures 220 extend along the y-direction and traverse respective semiconductor fins 210. In some embodiments, each of the dummy gate structure 220 may comprise a polysilicon (or poly) layer 222 over the fins 210, a hard mask layer 224 (for example, comprising $Si_3N_4$ or silicon carbon nitride (SiCN)) over the polysilicon layer 222, and another hard mask layer 226 (for example, comprising $SiO_2$) over the hard mask layer 224. In some embodiments, the hard mask layer 224 and the hard mask layer 226 include different dielectric materials. For example, the hard mask layer 224 comprises $Si_3N_4$ or SiCN and the hard mask layer 226 comprising $SiO_2$. In some embodiments, the dummy gate structure 220 may comprise other layers, such as an interfacial layer, a barrier layer, other suitable layers, or combinations thereof. The dummy gate structures 220 are formed by processes including deposition, lithography, etching, other suitable processes, or combinations thereof.

Referring to FIGS. 2 and 3A-3B, a spacer layer 228 is disposed over the dummy gate structures 220, the fins 210, and the isolation structure 204. In some embodiments, the spacer layer 228 includes silicon, oxygen, carbon, nitrogen, other suitable material, or combinations thereof (for example, $SiO_2$, $Si_3N_4$, SiON, SiCN, or silicon carbide (SiC), and/or silicon oxycarbonitride (SiOCN)). In some embodiments, the spacer layer 228 is formed by deposition, such as chemical vapor deposition (CVD), physical vapor deposition (PVD), atomic layer deposition (ALD), other suitable processes, or combinations thereof.

Referring to FIGS. 1 and 4A-4C, at operation 104, a pattern layer 230A is deposited over the spacer layer 228. In some embodiments, the pattern layer 230A includes a material that can provide different etching selectivity than the spacer layer 228. For example, the spacer layer 228 includes silicon and nitrogen, the pattern layer 230A also includes silicon and nitrogen (for example, $Si_3N_4$), however, a nitrogen concentration in the pattern layer 230A is different than that in the spacer layer 228. For example, a nitrogen in the pattern layer 230A is less than that in the spacer layer 228. In some embodiments, the pattern layer 230A is formed by a suitable deposition process, such as CVD, PVD, ALD, other suitable processes, or combinations thereof. In some embodiments, the pattern layer 230A has a thickness T1 along sidewalls of the spacer layer 228. Since the pattern layer 230A is used as a mask to form the S/D trench 236P (referring to FIG. 6C), the thickness T1 of the pattern layer 230A defines a push-in extent of the S/D trench 236P (i.e. a distance between a sidewall of the S/D trench and the closest sidewall of the spacer layer). Therefore, the size of the S/D trench 236P can be tuned, and the height of the first and second layers of the epitaxial S/D feature (for example, the epitaxial S/D features 240P in FIG. 8C and FIG. 9A) can be turned to achieve a desired FET performance. In some embodiments, the thickness T1 is about 6 nm to about 10 nm according to the designs of the device 200.

Referring to FIGS. 1 and 5A-5C to 7A-7C, at operation 106, S/D trenches are formed over a first region of the substrate 202. In the depicted embodiment, S/D trenches 236P are formed over the PFET region 202-P. The S/D trenches 236P are formed by various processes including deposition, photolithography, and/or etching processes. Referring to FIGS. 5A-5C, first, a hard mask layer 232 is deposited over the NFET region 202-N. In some embodiments, the hard mask layer 232 may be a single dielectric layer or may include multiple dielectric layers. Thereafter, a patterned photoresist layer 234 is formed over the hard mask layer 232 and is used as a mask to etch the hard mask layer 232 to cover the NFET region 202-N, such that the following etching process is only performed in the PFET region 202-P. The patterned photoresist layer 234 may then be removed.

Referring to FIGS. 6A-6C, the first S/D trenches 236P are formed in the PFET region 202-P. In some embodiments, first, an anisotropic etching process is performed to remove the portions of the pattern layer 230A in the x-y plane. Another anisotropic etching process is then performed to remove the portions of the spacer layer 228 in the x-y plane. Thereby, a top surface of the semiconductor fins 210 in the PFET region 202-P is exposed. The anisotropic etching process to remove the portions of the pattern layer 230A and the spacer layer 228 may include dry etching, wet etching, other etching method, or combinations thereof. For example, in the case that both the pattern layer 230A and the spacer layer 228 includes silicon and nitrogen, but with different nitrogen concentration, the etching process may include a main dry etching (for example, using carbon tetrafluoride ($CF_4$) and hydrogen bromide (HBr)) to anisotropically etch the pattern layer 230A and the spacer layer 228 and an over etching (for example, using difluoromethane ($CH_2F_2$)) to clean the surfaces of the remaining portions. In some other embodiments, the portions of the spacer layer 228 in the x-y plane may be removed before depositing the pattern layer 230A, thus the pattern layer 230A is deposited over the spacer layer 228 and the top surface of the semiconductor fins 210 in the PFET region 202-P. Therefore, at operation 106, only the portions of the pattern layer 230A in the x-y plane need to be removed to expose the top surfaces of the semiconductor fins 210 in the PFET region 202-P.

Thereafter, S/D regions of the semiconductor fins 210 in the PFET region 202-P are etched back to form the S/D trenches 236P. In the depicted embodiment, the fins 210 are etched along the sidewalls of the pattern layer 230A. Since a thickness T1 of the pattern layer 230A is about 6 nm to about 10 nm, each side of the first S/D trenches 236P along the x-direction are pushed in for a distance of T1 (i.e. about 6 nm to about 10 nm), compared with a conventional device without the pattern layer 230A. A depth D1 (in the z-direction) of the S/D trenches 236P can be controlled by the etching time. In the depicted embodiment, for a PU PFET of a SRAM cell, the depth D1 of the S/D trenches 236P is about 30 nm to about 50 nm. In some embodiments, the S/D trenches 236P are formed by a main etching process (for example, using chlorine gas ($Cl_2$) and nitrogen trifluoride ($NF_3$) for about 5 to 15 seconds) to form the shape of the S/D trenches 236P and followed by an isotropic etching process (for example, using hydrogen bromide (Hbr) and helium (He) for about 5 to about 20 seconds) to fine-tune the shape of the S/D trenches. Referring to FIGS. 7A-7C, the hard mask layer 232 is removed by a suitable process.

Referring to FIGS. 1 and 8A-8C, at operation 108, epitaxial S/D features 240P (i.e. p-type S/D features) are epitaxially grown in the S/D trenches 236P. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. In some implementations, the epitaxial S/D features 2336P are doped during deposition by adding impurities to a source material of the epitaxy process. In some implementations, the epitaxial S/D features 236P are doped by an ion implantation process subsequent to a deposition process. In some implementations, annealing processes are performed to activate the dopants in the epitaxial S/D features 236P of the device 200.

As shown in FIG. 8A, in some embodiments, the epitaxial S/D features 240P can have a substantially-diamond shaped cross-section, with a portion extending above the fin 210. Depending on the lateral distance (along the y-direction) between two adjacent fins 210 and the control of the epitaxial growth, the epitaxial S/D features 240P may be formed to have different merging profiles. In the depicted embodiment, the epitaxial S/D features 240P are grown over the S/D regions of each fin 210, separately. That is, each of the epitaxial S/D features is separated and none of the epitaxial features is merged (i.e., touch each other). In some other embodiments, the epitaxial S/D features are laterally merged together along the Y-direction and span more than one fin 210.

The epitaxial S/D features may comprise semiconductor materials such as silicon (Si), phosphorus (P), silicon phosphide ($Si_3P_4$), silicon carbide (SiC), germanium (Ge), silicon germanium (SiGe), one or more III-V materials, a compound semiconductor, or an alloy semiconductor. In the depicted embodiment, in the PFET region, the epitaxial S/D features 240P may include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer.

In some embodiments, the epitaxial S/D features 240P include one or more epitaxial layers grown in the S/D trenches. For example, a first epitaxial layer is deposited on the bottom and sidewall surfaces of the S/D trenches. Further, a second epitaxial layer is deposited on the first epitaxial layer in the S/D trenches. In some further embodiments, a third and/or a fourth epitaxial layer may further be deposited on the prior epitaxial layer. In some embodiments, the epitaxial S/D features 240P include materials and/or dopants that achieve desired tensile stress and/or compressive stress in the channel regions. In various embodiments, different epitaxial layer(s) of the epitaxial S/D features 240P may include same or different semiconductor materials.

FIG. 9A illustrates an enlarged view of the epitaxial S/D feature 240P in block X of FIG. 8C. An explanation of why the thickness of the pattern layer 230A affects the height of the epitaxial layers in the epitaxial feature 240P, and thus affect the PFET performance, is discussed here base on FIG. 9A. In the depicted embodiment, the epitaxial S/D feature 240P includes a first epitaxial layer 240P-1 and a second epitaxial layer 240P-2. In some embodiments, for a PFET, both the first epitaxial layers 240P-1 and the second epitaxial layer 240P-2 include SiGe and are doped with boron (B). The atomic concentration of Ge in SiGe and the doping concentration of B in the first epitaxial layer 240P-1 are less than those in the second epitaxial layer 240P-2. For example, the concentration of Ge in the epitaxial layer 240P-1 is about 15 at. % to about 30 at. %, and the doping concentration of B in the first epitaxial layer 240P-1 is about $1\times10^{20}$ cm$^{-3}$ to about $5\times10^{20}$ cm$^{-3}$. The concentration of Ge in the second epitaxial layer 240P-2 is about 30 at. % to about 70 at. %, and the doping concentration of B in the second epitaxial layer 240P-2 is about $5\times10^{20}$ cm$^3$ to about $1\times10^{21}$ cm$^{-3}$.

In some embodiments, the heights (thicknesses) of the first and second epitaxial layers in the epitaxial S/D feature 240P depend on the push-in extent T1 of the epitaxial S/D feature. Here, the push-in extent T1 of the epitaxial S/D feature is defined as a distance between a sidewall of the epitaxial S/D feature to a closest side wall of the spacer layer. In other words, the heights of the first and second epitaxial layers, can be tuned by the different thickness of the pattern layer 230A. Referring to FIG. 9A, the larger the push-in extent T1, the smaller the width W1 of the epitaxial S/D feature 240P, and the more space the first epitaxial layer 240P-1 occupies the S/D trench. Thus, the height (thickness) H1 of the first epitaxial layer 240P-1 (i.e. a distance between the bottom point of the second epitaxial layer 240P-2 and the bottom point of the first epitaxial layer 240P-1) becomes larger while the push-in extent T1 is turned to be larger. In other words, the first epitaxial layer 240P-1 includes a larger merging portion (shown in dashed lines) while the push-in extent T1 is turned to be larger. Therefore, less space is left for the second epitaxial layer 240P-2. Referring to FIG. 9A, the height (thickness) H2 of the second epitaxial layer 240P-2 (i.e. a distance between the lowest point of the top surface of the second epitaxial layer 240P-2 to a bottom point of the second epitaxial layer 240P-2) becomes smaller while the push-in extent T1 is turned to be larger. FIG. 9B illustrates a relationship between the PMOS (i.e. PFET) performance and the first epitaxial layer thereof. As depicted in FIG. 9B, using Vccmin=0 my as a reference (i.e. PMOS performance is 0%), the larger size (including side and bottom) the first epitaxial layer, the smaller size the higher epitaxial layer(s), the smaller write Vccmin, and the weaker performance of the PMOS (see, the bottom left portion of the dotted line). On the contrary, the smaller size (including side and bottom) the first epitaxial layer, the larger size the higher epitaxial layer(s), the greater write Vccmin, and the stronger performance of the PMOS (see, the top right portion of the dotted line). In other words, the performance of the PFET depends on the thickness of the epitaxial layer having the higher/highest Ge concentration and higher doping concentration (such as the second epitaxial layer in the depicted embodiment), the less height the second (or higher) epitaxial layer, the weaker performance the PFET. Thereby, the better read/write margin of the SRAM cell can be achieved. Therefore, controlling the thickness of the pattern layer 230A can fine-tune the size of the first epitaxial layer, thereby fin-tune the size of the second (or higher) epitaxial layer, thereby achieving the desired performance of the PFET and to control the read/write margin of the SRAM cell. Same effects apply to NFET as well. Accordingly, a ratio of the height H2 of the second epitaxial layer to the height D1 of the epitaxial S/D feature affects the performance of the FET. In some embodiments, for a FinFET with the epitaxial S/D features having a height D1 of about 30 nm to about 50 nm, when a push-in extent T1 is between 6 nm to about 10 nm, a ratio of the height H2 of the second epitaxial layer to the height D1 of the epitaxial S/D feature is about 0.2 to about 0.5. Similarly, when a push-in extent T1 is between 6 nm to about 10 nm, a ratio of the height of the first epitaxial layer H1 to the height D1 of the epitaxial S/D feature is about 0.5 to about 0.8. Or, when a push-in extent T1 is between 6 nm to about 10 nm, a ratio of the height of the second epitaxial layer H2 to the height of the first epitaxial layer H1 is about 1 to about 4.

Referring to FIGS. 1 and 10A-10C, at operation 110, the pattern layer 230A is removed. In some embodiments, the removing process is a selective etching process tuned to remove the pattern layer 230A but not the spacer layer 228. The selective etching process includes dry etching process, wet etching process, other etching process, or combinations thereof. In the depicted embodiment, where the pattern layer 230A included silicon and nitrogen, the removing process is a selective dry etching includes a main etching using carbon tetrafluoride ($CF_4$) and hydrogen bromide (HBr) to remove the pattern layer 230A and followed by an over etching using difluoromethane ($CH_2F_2$) to clean the surfaces of the spacer layer 228.

Figures 11A, 11B, 11C:
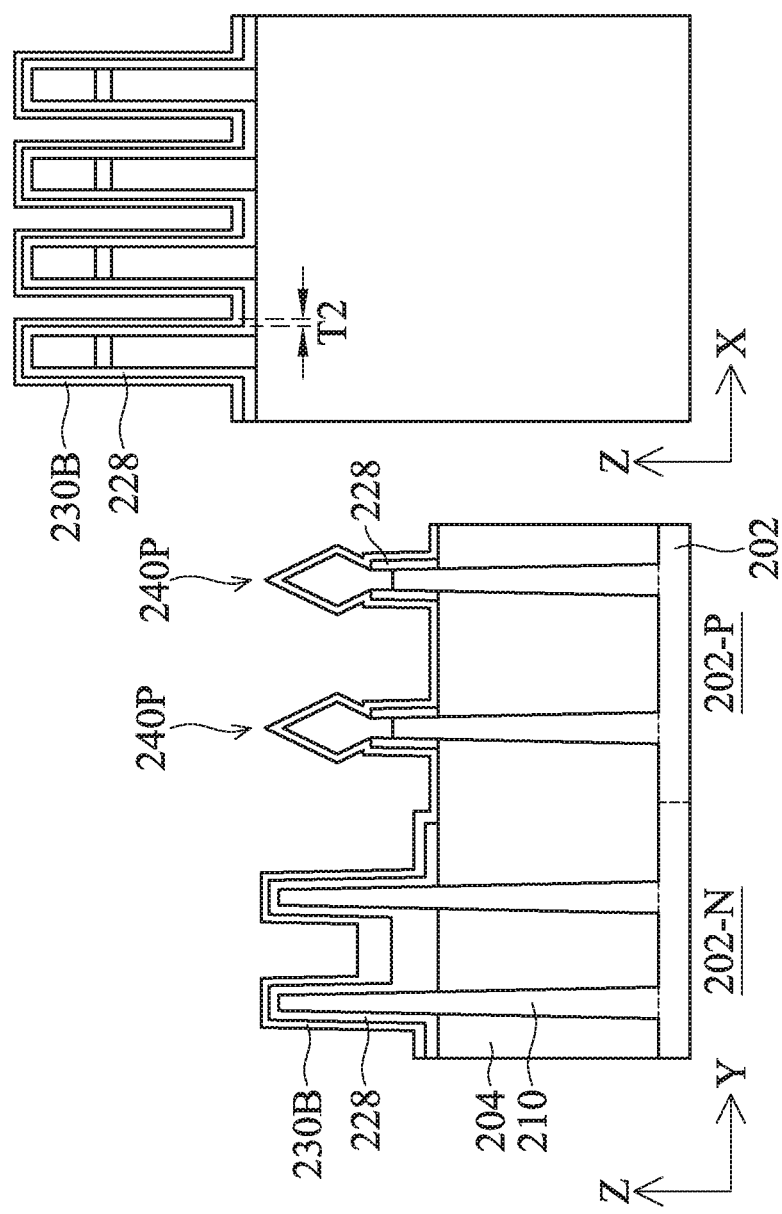
Figures 12A, 12B, 12C:
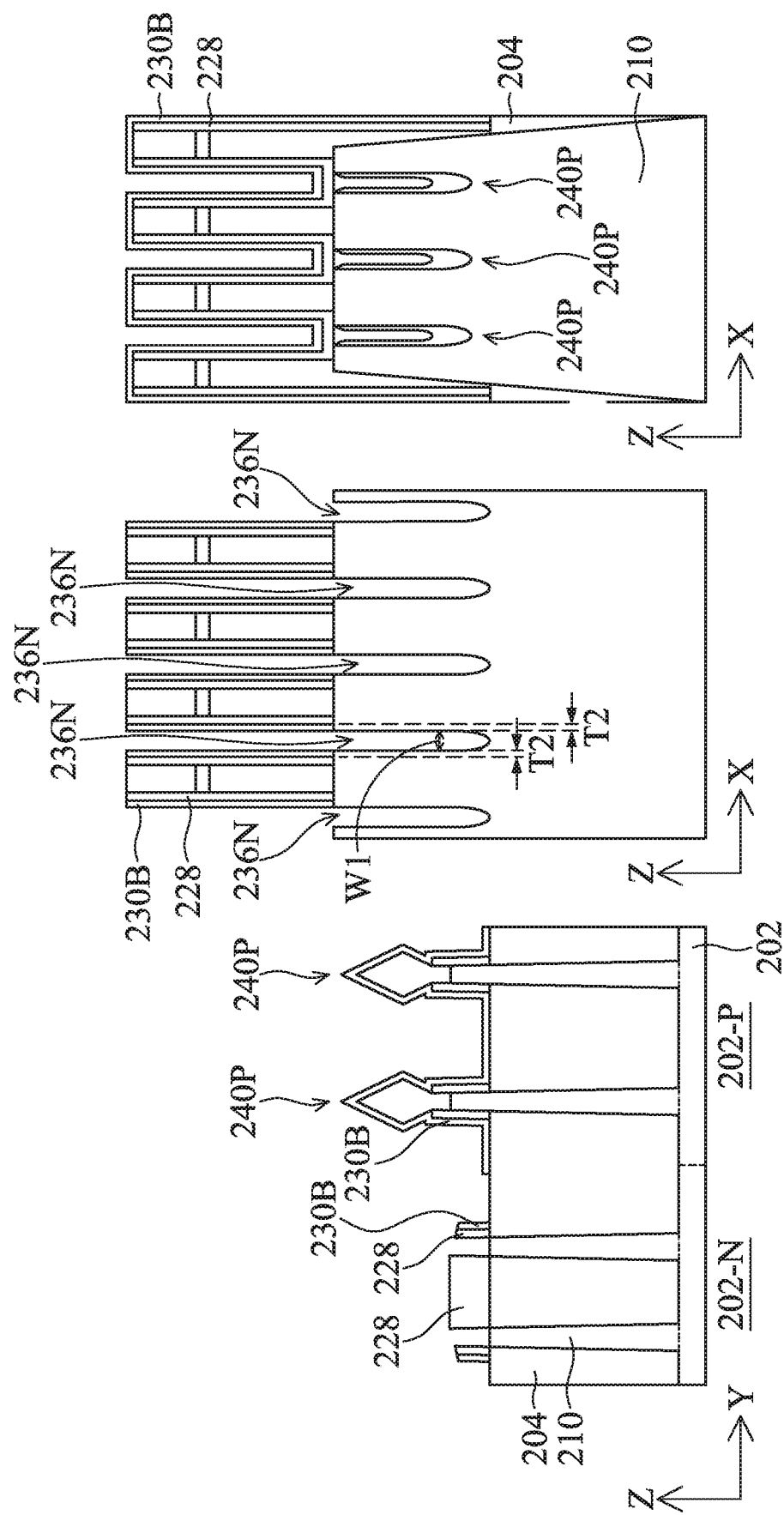
Figures 13A, 13B, 13C:
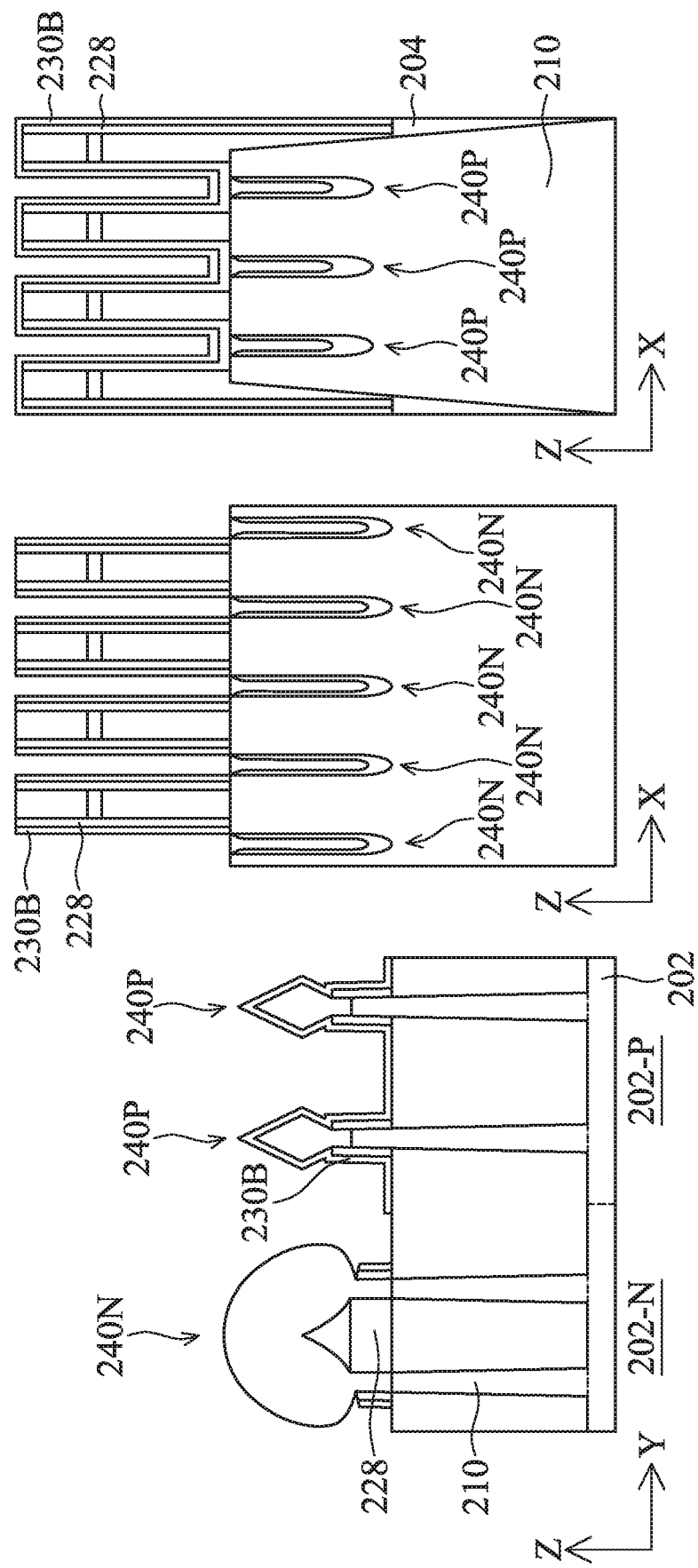
Figure 14C:
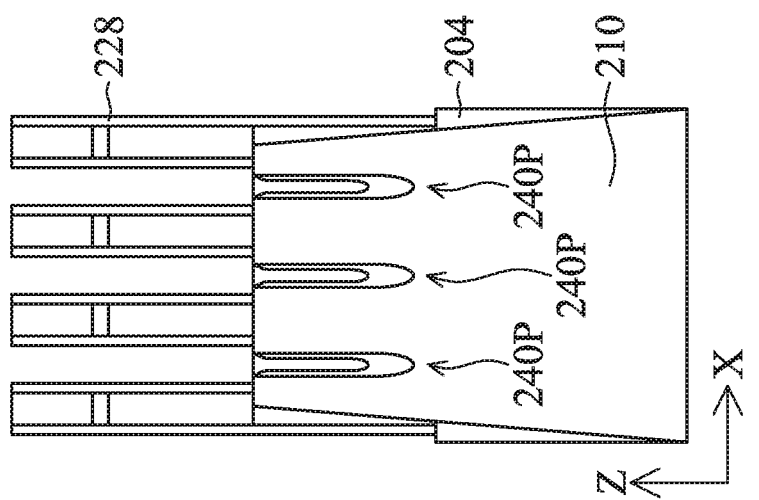
Figure 14B:
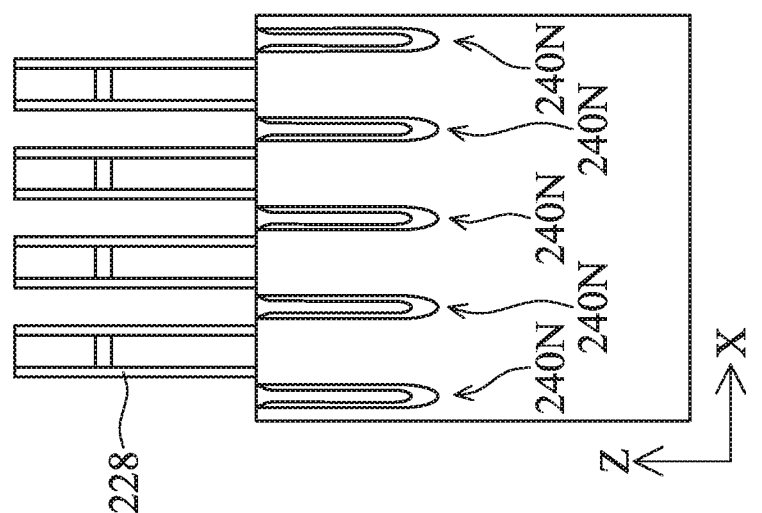
Figure 14A:
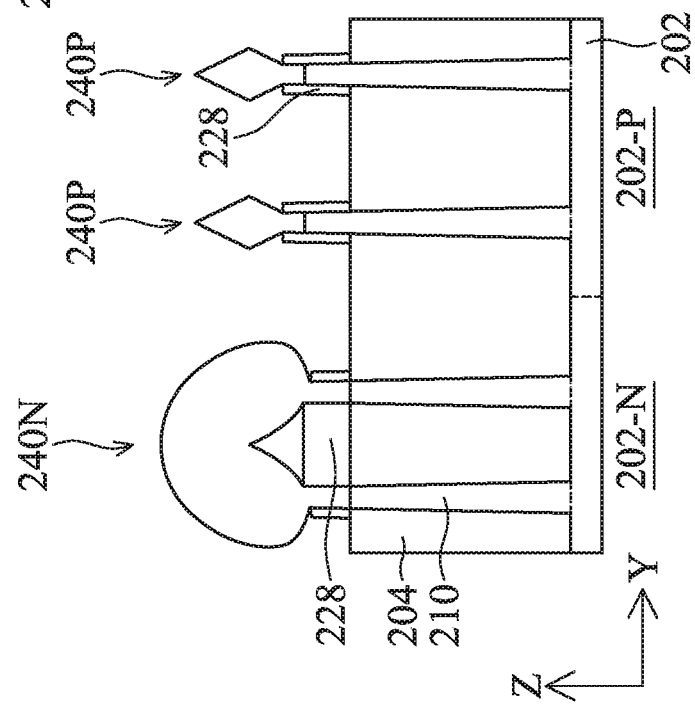

Referring to FIGS. 1 and 11A-11C, at operation 112, another pattern layer 230B with a thickness T2 is deposited over the spacer layer 228. Material of the pattern layer 230B and the formation process thereof are similar to those of the pattern layer 230A. However, the thickness T2 is different than the thickness T1 of the first pattern layer 230A. In the depicted embodiment, where the device 200 is a portion of an SRAM cell, the thickness T2 of the pattern layer 230B formed in the NFET region 202-N is less than the thickness T1 of the first pattern layer 230A formed in the PFET region 202-P. For example, the thickness T2 is less than about 6 nm, which is less the thickness T1 of about 6 nm to about 10 nm. As depicted in FIGS. 11A-11C, in the NFET region 202-N, the pattern layer 230B is deposited over the spacer layer 228; and in the PFET region 202-P, the pattern layer 230B is deposited over the top surfaces of the fins 210 and the epitaxial S/D features 240P, extending along the sidewalls of the spacer layer 228, and further extending over the top surfaces of the dummy gate structures 220. In other words, the second pattern layer 230B contacts the surface of spacer layer 228 in the NFET region 202-N and contacts the top surfaces of the spacers 228 and the dummy gate structures 220, the top surfaces of the epitaxial S/D features 240P and the fins 210, and the sidewall surfaces of the spacer layer 228 in the PFET region 202-P.

Referring to FIGS. 1 and 12A-12C, at operation 114, S/D trenches 236N are formed in the NFET region 202-N. The S/D trenches 236N are formed by processes similar to those described for operation 106. For example, first, the PFET region 202-P is covered by a patterned hard mask. Then, in the NFET region 202-N, the portions of the pattern layer 230B in the x-y plane are anisotropically removed, and further the portions of the spacer layer 228 in the x-y plane are anisotropically removed (or, the portions of the spacer layer 228 in the x-y plane are anisotropically removed before depositing the pattern layer 230B). Thereafter, the fins 210 in the NFET region 202-N are etched back along the sidewalls of the pattern layer 230B to form the S/D trenches 236N. In the depicted embodiment, the thickness T2 of the pattern layer 230B is less than the thickness T1 of the pattern layer 230A, thus the push-in extent T2 (less than about 6 nm) of the S/D trenches 236N in the NFET region is less than the push-in extent T1 (about 6 nm to about 10 nm) of the S/D trenches 236P in the PFET region. A depth D2 of the S/D trenches 236N can be controlled by etching time. In the depicted embodiment, the depth D2 of the S/D trenches 236N in the NFET region 202-N is greater than the depth D1 of the S/D trenches 236P in the PFET region 202-P. For example, for a PD NFET of a SRAM cell, the depth D2 of the second S/D trenches 236N is about 35 nm to about 55 nm.

Referring to FIGS. 1 and 13A-13C, at operation 116, epitaxial S/D features 240N (i.e. the n-type epitaxial S/D features) are epitaxially grown in the S/D trenches 236N. The fabrication process of the epitaxial S/D features 240N are similar as those of the first epitaxial S/D features 240P. In the depicted embodiment, the epitaxial S/D features 240N can be rounded and curved in shape, and may have a portion extending above the fin 210. The epitaxial S/D features 240N are laterally merged together along the Y-direction and span more than one fin 210. In the NFET region 202N, the epitaxial S/D features 240N may include materials such as silicon and/or carbon, where the silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer. In some embodiments, the epitaxial S/D features 240N also include one or more epitaxial layers grown in the S/D trenches 236N. For example, a first epitaxial layer is deposited on the bottom and sidewall surfaces of the S/D trenches and a second epitaxial layer is deposited on the first epitaxial layer. In some further embodiments, a third and/or a fourth epitaxial layer may further be deposited on the prior epitaxial layer. In some embodiments, the epitaxial S/D features 240N include materials and/or dopants that achieve desired tensile stress and/or compressive stress in the channel regions. In various embodiments, different epitaxial layer(s) of the epitaxial S/D features 240N may include same or different semiconductor materials.

Referring to FIGS. 1 and 14A-14C, at operation 118, the second pattern layer 230B is removed by a selective etching process similar to those described for operation 110.

Referring to FIGS. 1 and 15A-15C, at operation 120, other processes are performed to complete the fabrication of the device 200. For example, after forming an interlayer dielectric layer 242, the dummy gate structures 220 are removed to form gate trenches over the channel regions of the semiconductor fins 210. Thereafter, metal gate structures 244 are formed in the gate trenches in places of the dummy date structures. Each metal gate structure 244 includes a high-k dielectric layer, a metal gate electrode (including a work function metal and a bulk metal) disposed over the high-k dielectric layer, a hard mask layer, and/or other suitable layers. Subsequently, various other features may be formed to complete the fabrication. For example, contacts/ vias 246 and multilayer interconnect features (e.g., interlayer dielectric layers such as ILD layer 248 and/or metal layers such as metal lines 250) are formed over the device 200 and configured to connect the various features to form a functional circuit that may include one or more multi-gate devices.

FIGS. 16A and 16B illustrate the enlarged views of the blocks E and F in FIGS. 15B and 15C, respectively. As depicted in FIGS. 16A and 16B, the p-type epitaxial S/D features 240P include a p-type epitaxial layer 240P-1 and another p-type epitaxial layer 240P-2, and the n-type epitaxial S/D features 240N include an n-type epitaxial layer 240N-1 and another n-type epitaxial layer 240N-2. The p-type epitaxial S/D features 240P has a height D1 in the z-direction and a width W1 in the x-direction, and the n-type epitaxial S/D features 240N has a height D2 in the z-direction and a width W2 in the x-direction. In the depicted embodiment, D1 is less than D2, which can be controlled by the etching time to form the S/D trenches; and W1 is less than W2 due to the different push-in extents of the p-type and n-type epitaxial S/D features. Referring to FIGS. 16A and 16B, the push-in extent T1 of the p-type epitaxial S/D feature 240P (i.e. the thickness T1 of the pattern layer 230A) is greater than the push-in extent T2 of the n-type epitaxial S/D feature 240N (i.e. the thickness T2 of the pattern layer 230B), thus the width W1 of the p-type epitaxial S/D feature 240P is less than the width W2 of the n-type epitaxial S/D feature 240N. Therefore, the p-type epitaxial layer 240P-1 occupies more space ratio (i.e. a ratio of the space that an epitaxial layer occupies in a S/D trench) in the S/D trenches 236P than the n-type epitaxial layer 240N-1 occupies in the S/D trenches 236N. The p-type epitaxial layer 240P-1 has a larger merging portion (illustrated in the dashed lines) than the n-type epitaxial layer 240N-1. Accordingly, a ratio of the height H1 of the p-type epitaxial layer 240P-1 to the height D1 of the epitaxial S/D feature 240P (for example, about 0.2 to about 0.5) is greater than a ratio of the height H3 of the p-type epitaxial layer 240N-1 to the height D2 of the epitaxial S/D feature 240N (for example, about 0.1 to about 0.3). Thereby, a ratio of the height H2 of the p-type epitaxial layer 240P-2 to the height D1 of the epitaxial S/D feature 240P (for example, about 0.5 to about 0.8) is less than a ratio of the height H4 of the n-type epitaxial layer 240N-2 to the height D2 of the epitaxial S/D feature 240N (for example, about 0.7 to about 0.9). In other words, a ratio of the height H2 of the p-type epitaxial layer 240P-2 to the height H1 of the p-type epitaxial layer 240P-1 (for example, about 1 to about 4) is less than a ratio of the height H4 of the n-type epitaxial layer 240N-2 to the height H3 of the first n-type epitaxial layer 240N-1 (for example, about 2 to about 9). Similar to those discussed for FIG. 9A, the more push-in extent of the epitaxial feature, the less space of the highly doped epitaxial layer(s), and the weaker the performance of the FET. Thus, the read/write margin of the SRAM cell can be improved by increasing the push-in extent of the p-type epitaxial feature, i.e. by increasing the thickness of the pattern layer for the PFET.

Figure 17:
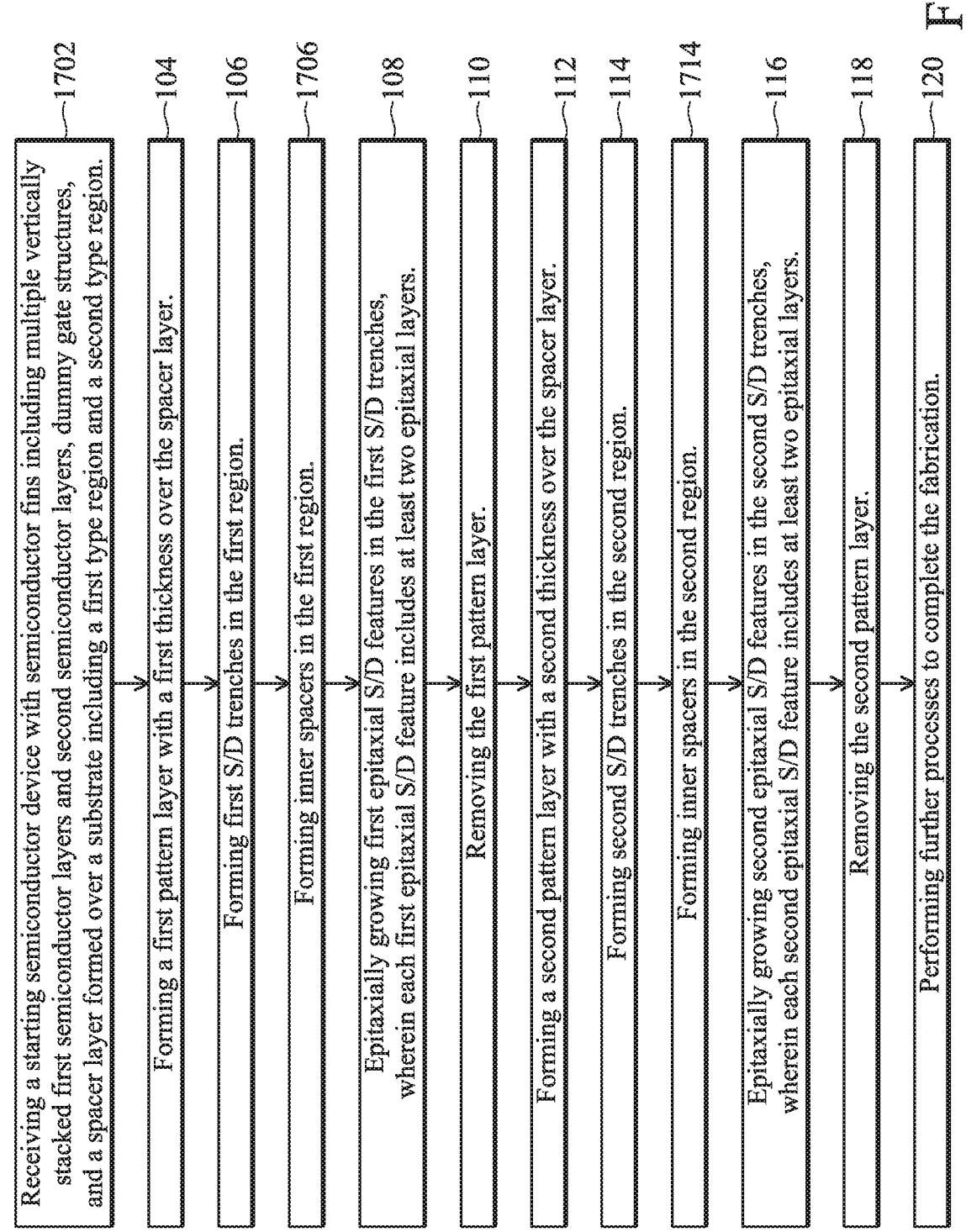
FIG. 17 illustrates a flowchart of another example method for making another example semiconductor device in accordance with some other embodiments of the present disclosure.

FIG. 17 illustrates a flow chart of a method 1700 for forming a semiconductor device 1800 (hereafter called device 1800) in accordance with some other embodiments of the present disclosure. Method 1700 is merely an example and is not intended to limit the present disclosure beyond what is explicitly recited in the claims. Additional operations can be performed before, during, and after method 1700, and some operations described can be replaced, eliminated, or moved around for additional embodiments of the method. Method 1700 is described below in conjunction with other figures, which illustrate various cross-sectional views of device 1800 during intermediate steps of method 1700.

Figure 18:
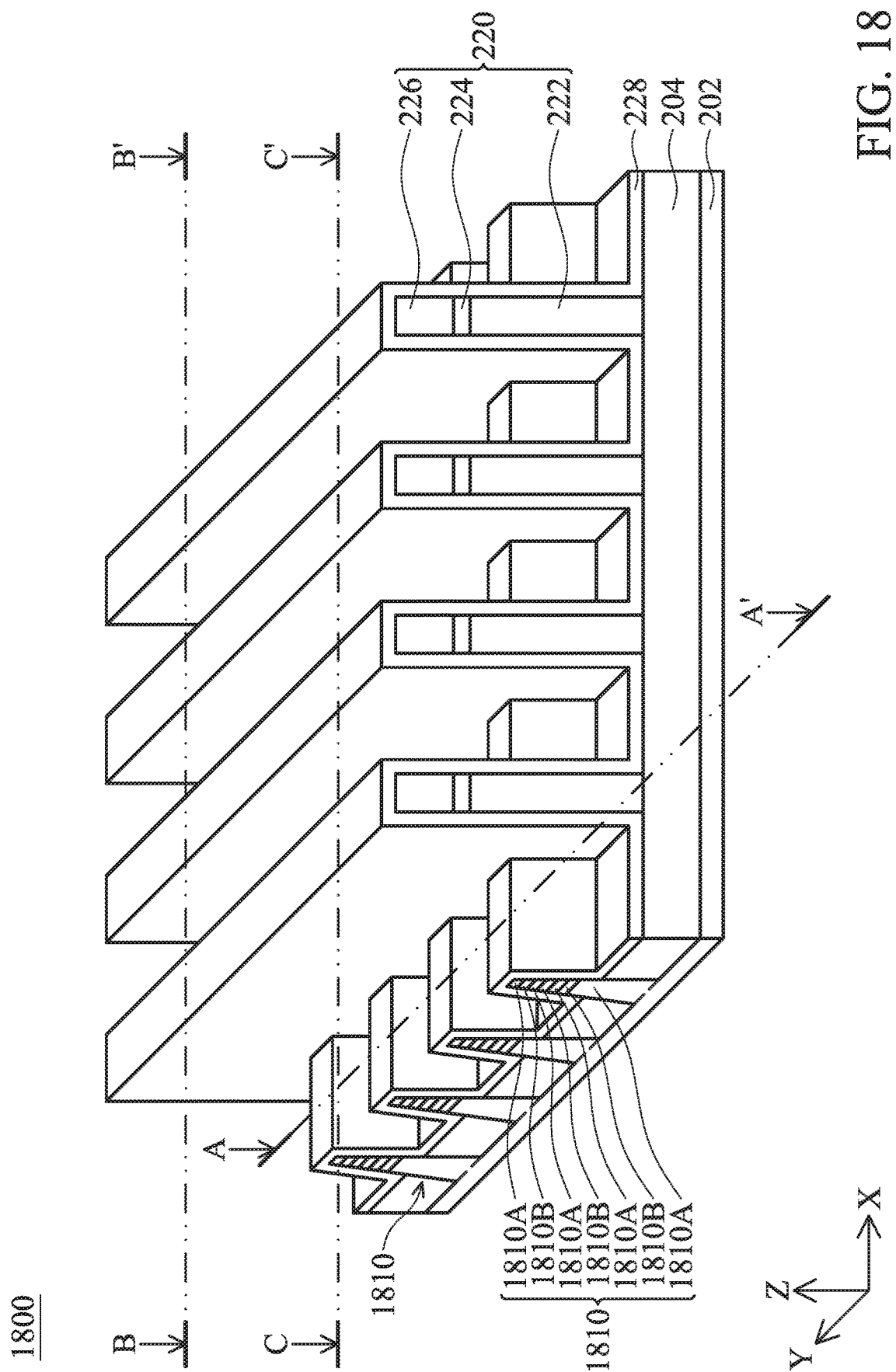
FIG. 18 illustrates a three-dimension view of the other example semiconductor device in accordance with some embodiments of the present disclosure.
Figure 26C:
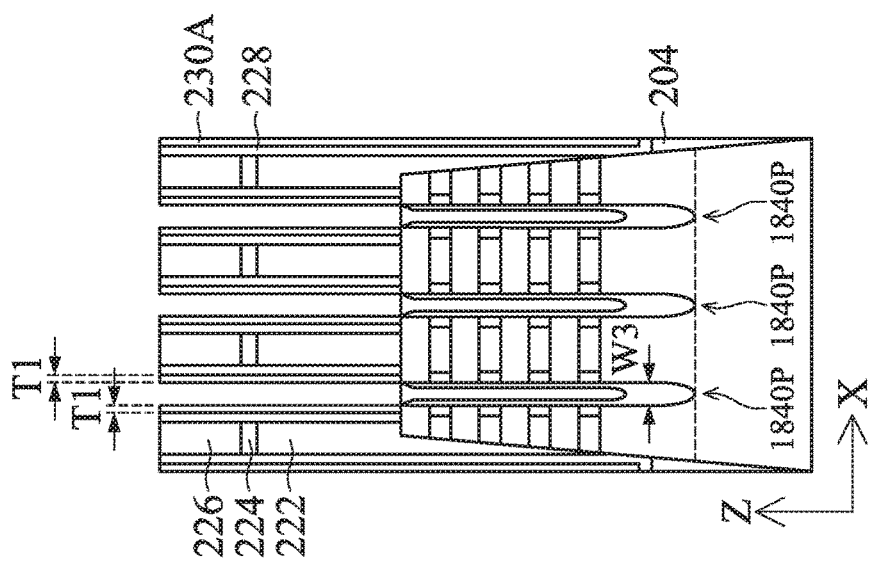
Figure 26B:
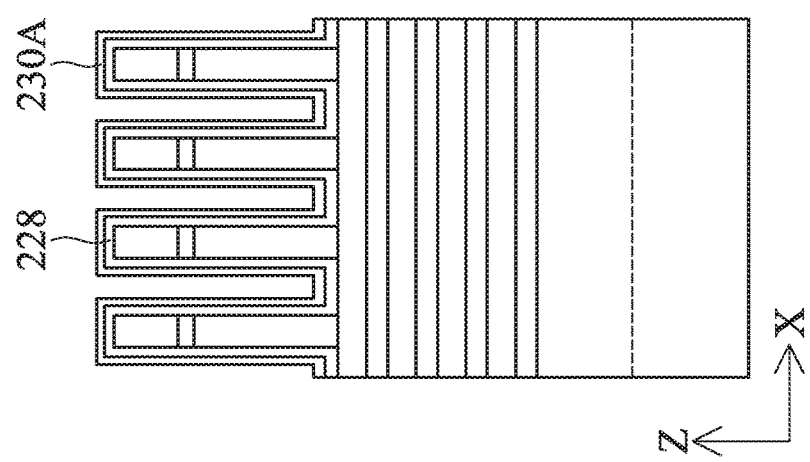
Figure 26A:
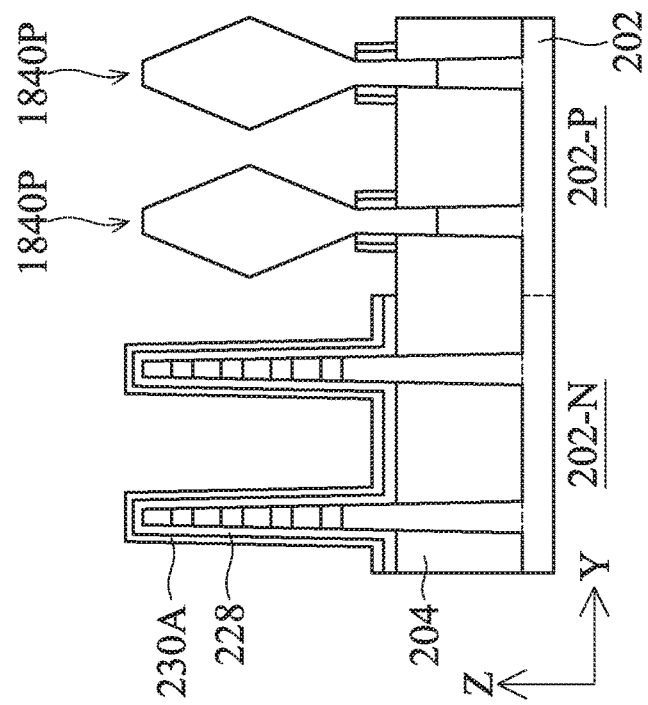
Figures 28A, 28B, 28C:
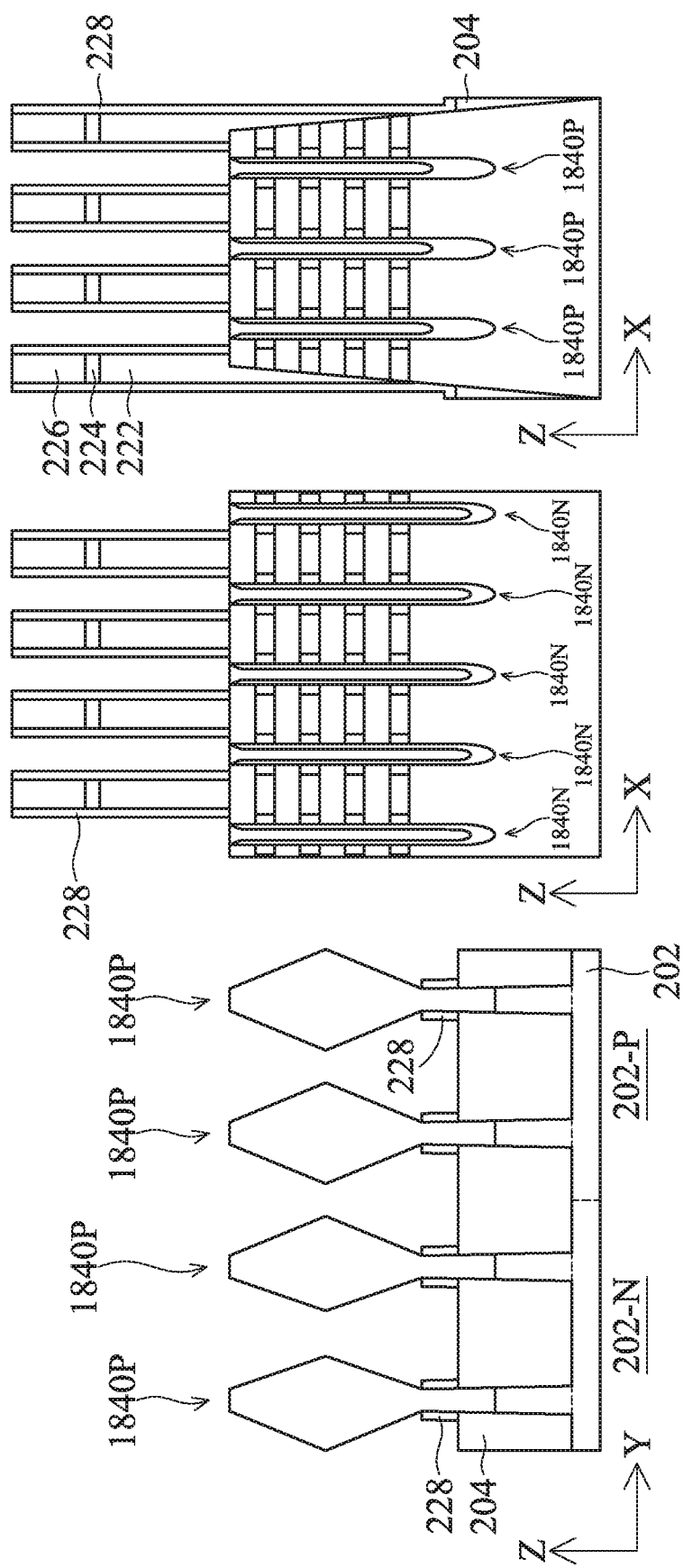

FIG. 18 illustrate a three-dimensional view of the starting device 1800 in accordance with some embodiments of the present disclosure. FIGS. 19A-19C through 29A-29C illustrate cross-sectional views of intermediate stages in the formation of the device 1800. Many features of the device 1800 are similar to those of the device 200. For the sake of simplicity, some reference numerals of the device 200 are repeated in the device 1800 to indicate same or similar features. Further, some of the fabrication steps of these embodiments are similar to those shown in FIGS. 3A-3C through 15A-15C, and hence the details of those formation processes are not repeated herein.

Referring to FIGS. 17, 18, and 19A-19C, the starting device 1800 is received. The starting device 1800 includes semiconductor fins 1810 which are semiconductor layer stacks. In other words, the semiconductor layer stacks 1810 are formed with fin-shape protruding from the substrate 202. Each semiconductor layer stack 1810 includes a first type semiconductor layer 1810A and a second type semiconductor layer 1810B. The semiconductor layer 1810A includes a first semiconductor material and the semiconductor layer 1810B includes a second semiconductor material different from the first semiconductor material. The different semiconductor materials in the alternating semiconductor layers 1810A and 1810B provide different oxidation rates and/or different etch selectivity. In some examples, the first semiconductor layers 1810A include silicon (Si, same as the substrate 202), and the second semiconductor layers 1810B include silicon germanium (SiGe). Thus, the example semiconductor layer stack 1810 is arranged with alternating Si/SiGe/Si/SiGe . . . layers from bottom to top. The device 1800 also includes the isolation feature 204 separating the lower portions of the semiconductor layer stacks 1810, dummy gate structures 220 engaging the channel regions of the semiconductor stacks 1810, and a spacer layer 228 deposited over the semiconductor stacks 1800, the dummy gate structures 220, and the isolation feature 204.

Referring to FIGS. 17 and 20A-20C to 24A-24C, at operations 104 and 106, the pattern layer 230A with a thickness T1 (for example, about 6 nm to about 10 nm) is deposited over the spacer 228, and first S/D trenches 1836P are formed in the PFET region 202-P. As depicted in FIG. 23C, the S/D trenches 1836P are formed with a depth D3 and a width W3. The width W3 of the S/D trenches 1836P can be tuned by the thickness T1 of the pattern layer 230 (i.e. the push-in extent T1). In some embodiment, the depth D3 is about 45 nm to about 70 nm. And, the push-in extent T1 is about 6 nm to about 10 nm. The sidewalls of the semiconductor layers 1810A and the semiconductor layers 1810B are exposed in the S/D trenches 1836P. Subsequently, the hard mask 232 is removed.

Referring to FIGS. 17 and 25A-25C, at operations 1706, inner spacers 1838 are formed in the S/D trenches 1836P to replace side portions of the semiconductor layers 1810B. The inner spacers 1838 are formed by various steps. For example, first, the side portions of the semiconductor layers 1810B exposed in the S/D trenches 1836P are selectively removed (for example, by a selective oxidation and/or a selective etching process) to form gaps between the semiconductor layers 1810A. Thereafter, a dielectric material (a low-k dielectric material, such as silicon nitride, other dielectric material, or combinations thereof) is deposited in the S/D trenches 1836P to fill in the gap between the semiconductor layers 1810A. An etching process may then be performed to remove the excessive dielectric material and to expose the sidewalls of the semiconductor layers 1810A. The remaining portion of the dielectric material forms the inner spacers 1838.

Now referring to FIGS. 17 and 26A-26C, at operations 108, epitaxial S/D features 1840-P are formed in the S/D trenches 1836P. The epitaxial S/D features 1840-P are formed with a height D3 (about 45 nm to about 70 nm) and a width W3. The width W3 of the epitaxial S/D features 1840-P can be tuned by the push-in extent T1, which is the thickness of the pattern layer 230A and is about 6 nm to about 10 nm.

Referring to FIGS. 17 and 27A-27C, at operations 110, 112, 114, 1714, and 116, similar processes are performed in the NFET region 202-N to form epitaxial S/D features 1840N. In some embodiments, the epitaxial S/D features 1840N are formed with a height D4 (the S/D trenches in the NFET region has a depth D4). In some embodiments, the height D4 is substantially equal to the height D3. When using the term "substantially" in this specification, it means a difference equal to or less than 10%. In some embodiments, the height D4 is about 45 nm to about 70 nm. And, a width W4 in the x-direction of the epitaxial S/D features 1840N can be tuned by the push-in extent T2 (a thickness of the pattern layer 230B), which is less than about 6 nm.

Referring to FIGS. 17, 28A-28C and 29A-29C, at operations 118 and 120, other processes are performed to complete the fabrication. For example, a gate replacement process is performed such that metal gate structures 1844 are formed to wrap around each of the semiconductor layers 1810A. The gate replacement process involves various steps. For example, after forming an ILD layer 242, the dummy gate structures 220 are removed to expose the channel regions of the semiconductor stacks 1810. Thereafter, the semiconductor layers 1810B in the channel regions are selectively removed, while keep the semiconductor layers 1810A substantially unchanged. The semiconductor layers 1810A may be vertically stacked up and separated from each other. Each of the semiconductor layer 1810A may be in a shape of a nanowire, a nanosheet, or other nanostructures. Then, the metal gate structures 244 including high-k dielectric layers, metal gate electrodes, and/or other suitable layers are deposited over the channel regions of the semiconductor stacks 1810 to wrap around each semiconductor layer 1810A. Subsequently, various other features such as contacts/vias and multilayer interconnect features may be formed to complete the fabrication.

FIGS. 30A and 30B illustrate the enlarged views of the blocks G and H in FIGS. 29B and 29C, respectively. In the depicted embodiment, the p-type epitaxial S/D feature 1840P includes a p-type epitaxial layer 1840P-1 and another p-type epitaxial layer 1840P-2 over the epitaxial layer 1840P-1, and the n-type epitaxial S/D feature 1840N comprises an n-type epitaxial layer 1840N-1 and another n-type epitaxial layer 1840N-2 over the epitaxial layer 1840N-1. The p-type epitaxial S/D features 1840P has a height D3 in the z-direction and a width W3 in the x-direction, and the n-type epitaxial S/D features 1840N has a height D4 in the z-direction and a width W4 in the x-direction. In the depicted embodiment, D3 is substantially equal to D4 (controlled by the etching time to form the S/D trenches); and W3 is less than W4 due to the different push-in extents of the p-type and n-type epitaxial S/D features. Referring to FIGS. 30A and 30B, the push-in extent T1 of the p-type epitaxial S/D feature 1840P (i.e. the thickness T1 of the first pattern layers 230A) is greater than the push-in extent T2 of the n-type epitaxial S/D feature 1840N (i.e. the thickness T2 of the second pattern layer 230B), thus the width W3 of the p-type epitaxial S/D feature 1840P is less than the width W4 of the n-type epitaxial S/D feature 1840N. Therefore, the p-type epitaxial layer 1840P-1 occupies more space ratio in the S/D trenches in the PFET region than the n-type epitaxial layer 1840N-1 occupies in the S/D trenches in the NFET region. The p-type epitaxial layer 1840P-1 has a larger merging portion (illustrated in the dashed lines) than the n-type epitaxial layer 1840N-1. Therefore, a ratio of the height H5 of the p-type epitaxial layer 1840P-1 to the height D3 of the epitaxial S/D feature 1840P (for example, about 0.2 to about 0.5) is greater than a ratio of the height H7 of the p-type epitaxial layer 1840N-1 to the height D4 of the epitaxial S/D feature 1840N (for example, about 0.1 to about 0.3). Accordingly, a ratio of the height H6 of the p-type epitaxial layer 1840P-2 to the height D3 of the epitaxial S/D feature 1840P (for example, about 0.5 to about 0.8) is less than a ratio of the height H8 of the n-type epitaxial layer 1840N-2 to the height D4 of the second epitaxial S/D feature 1840N (for example, about 0.7 to about 0.9). In other words, a ratio of the height H6 of the p-type epitaxial layer 1840P-2 to the height H5 of the p-type epitaxial layer 1840P-1 (for example, about 1 to about 4) is less than a ratio of the height H8 of the n-type epitaxial layer 1840N-2 to the height H7 of the n-type epitaxial layer 1840N-1 (for example, about 2 to about 9). Similar to those discussed for FIGS. 9 and 16A, 16B, the more push-in extent of the epitaxial feature, the less space of the highly doped epitaxial layer(s), the weaker the performance of the FET. Thus, the read/write margin of the SRAM cell can be improved by increasing the push-in extent of the p-type epitaxial feature, i.e. by increasing the thickness of the pattern layer for the PFET.

Although not intended to be limiting, one or more embodiments of the present disclosure provide many benefits to a semiconductor device and a formation process thereof. For example, embodiments of the present disclosure provide a semiconductor device (such as a SRAM) with a PFET having a multi-layer p-type S/D epitaxial feature and a NFET having a multi-layer n-type S/D epitaxial feature. Wherein, the width of the p-type S/D epitaxial feature and/or the n-type S/D epitaxial feature can be fine-tuned by a thickness of a pattern layer (i.e. a push-in extent). In some embodiments, due to a greater push-in extent in the PFET region, the PU PFETs can achieve a weaker performance, thus the alpha ratio of the SRAM cell can be reduced, and the read/write margin of the SRAM cell can be improved.

The present disclosure provides for many different embodiments. Semiconductor device having air gaps formed in the metal gates and methods of fabrication thereof are disclosed herein. An exemplary method includes providing a structure having a first semiconductor fin in a first region of a substrate and a second semiconductor fin in a second region of the substrate, a first dummy gate stack over the first semiconductor fin, a second dummy gate stack over the second semiconductor fin, and a spacer layer over the first and the second dummy gate stacks; forming a first pattern layer with a first thickness along sidewalls of the spacer layer in the first region; etching the first semiconductor fin along sidewalls of the first pattern layer to form a first source/drain (S/D) trench; epitaxially growing a first epitaxial feature in the first S/D trench; removing the first pattern layer to expose the spacer layer; forming a second pattern layer with a second thickness along the sidewalls of the spacer layer in the second region, wherein the second thickness is different from the first thickness; etching the second semiconductor fin along sidewalls of the second pattern layer to form a second S/D trench; epitaxially growing a second epitaxial feature in the second S/D trench; and removing the second pattern layer to expose the spacer layer.

In some embodiments, epitaxially growing the first epitaxial feature includes epitaxially growing a first epitaxial layer in the first trench and a second epitaxial layer over the first epitaxial layer in the first trench; and epitaxially growing the second epitaxial feature includes epitaxially growing a third epitaxial layer in the second trench and a fourth epitaxial layer over the third epitaxial layer in the second trench; wherein a first ratio of a height of the second epitaxial layer to a height of the first epitaxial feature is less than a second ratio of a height of the fourth epitaxial layer to a height of the second epitaxial feature.

In some embodiments, the first region is for p-type field-effect transistor (PFET) and the second region is for n-type field-effect transistor (NFET), and the first thickness is greater than the second thickness. And, in some further embodiments, the first thickness is about 6 nm to about 10 nm.

In some embodiments, the spacer layer includes a first nitride, the first pattern layer and the second pattern layer include a second nitride, and a nitrogen concentration in the second nitride is less than a nitrogen concentration in the first nitride. And, in some further embodiments, the first and the second pattern layers are removed by a selective etching process using carbon tetrafluoride ($CF_4$) and hydrogen bromide (HBr).

Another exemplary method includes providing a structure having a first semiconductor layer stack in a first region of a substrate and a second semiconductor layer stack in a second region of the substrate, a first dummy gate stack over the first semiconductor layer stack, a second dummy gate stack over the second semiconductor layer stack, and a spacer layer over the first and the second dummy gate stacks, wherein each of the first and the second semiconductor layer stacks includes a first semiconductor layer and a second semiconductor layer having different semiconductor materials; forming a first pattern layer with a first thickness along sidewalls of the spacer layer over the first dummy gate stack; etching the first semiconductor layer stack along sidewalls of the first pattern layer to form a first source/drain (S/D) trench; epitaxially growing a first epitaxial feature in the first S/D trench; removing the first pattern layer to expose the spacer layer; forming a second pattern layer with a second thickness over the sidewalls of the spacer layer over the second dummy gate stack, wherein the second thickness is less than the first thickness; etching the second semiconductor layer stack along sidewalls of the second pattern layer to form a second S/D trench; epitaxially growing a second epitaxial feature in the second S/D trench; removing the second pattern layer to expose the spacer layer; and forming a metal gate structure wrapping around each of the first semiconductor layers.

In some embodiments, each of the forming of the first pattern layer and the forming of the second pattern layer includes depositing a dielectric layer over the spacer layer; after depositing the dielectric layer, anisotropically removing portions of the dielectric layer substantially parallel to a top surface of the substrate; and anisotropically removing portions of the spacer layer substantially parallel to the top surface of the substrate.

In some embodiments, each of the forming of the first pattern layer and the forming of the second pattern layer includes anisotropically removing portions of the spacer layer substantially parallel to a top surface of the substrate; after the anisotropically removing portions of the spacer layer, depositing a dielectric layer over the spacer layer; and anisotropically removing portions of the dielectric layer substantially parallel to the top surface of the substrate.

In some embodiments, the epitaxially growing the first epitaxial feature includes epitaxially growing a first epitaxial layer for a first height in the first S/D trench and epitaxially growing a second epitaxial layer for a second height over the first epitaxial layer in the first S/D trench; the epitaxially growing the second epitaxial feature includes epitaxially growing a third epitaxial layer for a third height in the second S/D trench and epitaxially growing a fourth epitaxial layer having a fourth height over the second epitaxial layer in the second S/D trench; and a first ratio of the first height to the second height is less than a second ratio of the third height to the fourth height.

In some embodiments, the first and the second pattern layers include silicon nitride.

In some embodiments, a height of the first epitaxial feature is substantially equal to a height of the second epitaxial feature.

An exemplary semiconductor device includes a first semiconductor fin over a first region of a substrate and a second semiconductor fin over a second region of the substrate; a first metal gate structure over the first semiconductor fin and a second metal gate structure over the second semiconductor fin; a first spacer along a sidewall of the first metal gate structure and a second spacer along a sidewall of the second metal gate structure; and a first epitaxial feature over the first semiconductor fin and a second epitaxial feature over the second semiconductor fin, wherein the first epitaxial feature includes a first epitaxial layer and a second epitaxial layer formed over the first epitaxial layer, the second epitaxial feature includes a third epitaxial layer and a fourth epitaxial layer formed over the third epitaxial layer, and a first ratio of a height of the second epitaxial layer to a height of the first epitaxial feature is less than a second ratio of a height of the fourth epitaxial layer to a height of the second epitaxial feature.

In some embodiments, the first region is for p-type field-effect transistor (PFET) and the second region is for n-type field-effect transistor (NFET).

In some embodiments, a height of the second epitaxial layer is less than a height of the fourth epitaxial layer. In some embodiments, a first distance between a sidewall of the first epitaxial feature and a sidewall of the first spacer is greater than a second distance between a sidewall of the second epitaxial feature and a sidewall of the second spacer. In some embodiments, the first ratio is about 50% to about 80%. In some embodiments, the second ratio is about 70% to about 90%.

In some embodiments, the first epitaxial layer has a first dopant concentration and the second epitaxial layer has a second dopant concentration greater than the first dopant concentration; and the third epitaxial layer has a third dopant concentration and the fourth epitaxial layer has a fourth dopant concentration greater than the third dopant concentration.

In some embodiments, each of the first semiconductor fin and the second semiconductor fin includes multiple semiconductor layers, and the first metal gate stack wraps around each of the multiple semiconductor layers of the first semiconductor fin and the second metal gate stack wraps around each of the multiple semiconductor layers of the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    providing a structure having a first semiconductor fin in a first region of a substrate and a second semiconductor fin in a second region of the substrate, a first dummy gate stack over the first semiconductor fin, a second dummy gate stack over the second semiconductor fin, and a spacer layer over the first and the second dummy gate stacks;
    forming a first pattern layer with a first thickness along sidewalls of the spacer layer in the first region;
    etching the first semiconductor fin along sidewalls of the first pattern layer to form a first source/drain (S/D) trench;
    epitaxially growing a first epitaxial feature in the first S/D trench, wherein epitaxially growing the first epitaxial feature includes epitaxially growing a first epitaxial layer in the first trench and a second epitaxial layer over the first epitaxial layer in the first trench;
    removing the first pattern layer to expose the spacer layer;
    forming a second pattern layer with a second thickness along the sidewalls of the spacer layer in the second region, wherein the second thickness is different from the first thickness;
    etching the second semiconductor fin along sidewalls of the second pattern layer to form a second S/D trench;
    epitaxially growing a second epitaxial feature in the second S/D trench, wherein epitaxially growing the second epitaxial feature includes epitaxially growing a third epitaxial layer in the second trench and a fourth epitaxial layer over the third epitaxial layer in the second trench, and wherein a first ratio of a height of the second epitaxial layer to a height of the first epitaxial feature is less than a second ratio of a height of the fourth epitaxial layer to a height of the second epitaxial feature; and
    removing the second pattern layer to expose the spacer layer.

2. The method of claim 1, wherein the first region is for p-type field-effect transistor (PFET) and the second region is for n-type field-effect transistor (NFET), and the first thickness is greater than the second thickness.

3. The method of claim 2, wherein the first thickness is about 6 nm to about 10 nm.

4. The method of claim 1, wherein the spacer layer includes a first nitride, the first pattern layer and the second pattern layer include a second nitride, and a nitrogen concentration in the second nitride is less than a nitrogen concentration in the first nitride.

5. The method of claim 4, wherein the first and the second pattern layers are removed by a selective etching process using carbon tetrafluoride ($CF_4$) and hydrogen bromide (HBr).

6. A method of forming a semiconductor device, comprising:
    providing a structure having a first semiconductor layer stack in a first region of a substrate and a second semiconductor layer stack in a second region of the substrate, a first dummy gate stack over the first semiconductor layer stack, a second dummy gate stack over the second semiconductor layer stack, and a spacer layer over the first and the second dummy gate stacks, wherein each of the first and the second semiconductor layer stacks includes a first semiconductor layer and a second semiconductor layer having different semiconductor materials;
    forming a first pattern layer with a first thickness along sidewalls of the spacer layer over the first dummy gate stack;
    etching the first semiconductor layer stack along sidewalls of the first pattern layer to form a first source/drain (S/D) trench;
    epitaxially growing a first epitaxial feature in the first S/D trench, wherein epitaxially growing the first epitaxial feature includes:
        epitaxially growing a first epitaxial layer for a first height in the first S/D trench; and
        epitaxially growing a second epitaxial layer for a second height over the first epitaxial layer in the first S/D trench;
    removing the first pattern layer to expose the spacer layer;
    forming a second pattern layer with a second thickness over the sidewalls of the spacer layer over the second dummy gate stack, wherein the second thickness is less than the first thickness;
    etching the second semiconductor layer stack along sidewalls of the second pattern layer to form a second S/D trench;
    epitaxially growing a second epitaxial feature in the second S/D trench, wherein epitaxially growing the second epitaxial feature includes:
        epitaxially growing a third epitaxial layer for a third height in the second S/D trench; and
        epitaxially growing a fourth epitaxial layer having a fourth height over the second epitaxial layer in the second S/D trench; wherein a first ratio of the first height to the second height is less than a second ratio of the third height to the fourth height;
    removing the second pattern layer to expose the spacer layer; and
    forming a metal gate structure wrapping around each of the first semiconductor layers.

7. The method of claim 6, wherein each of the forming of the first pattern layer and the forming of the second pattern layer includes:
    depositing a dielectric layer over the spacer layer;
    after depositing the dielectric layer, anisotropically removing portions of the dielectric layer substantially parallel to a top surface of the substrate; and
    anisotropically removing portions of the spacer layer substantially parallel to the top surface of the substrate.

8. The method of claim 6, wherein each of the forming of the first pattern layer and the forming of the second pattern layer includes:
    anisotropically removing portions of the spacer layer substantially parallel to a top surface of the substrate;
    after the anisotropically removing portions of the spacer layer, depositing a dielectric layer over the spacer layer; and
    anisotropically removing portions of the dielectric layer substantially parallel to the top surface of the substrate.

9. The method of claim 6, wherein the first and the second pattern layers include silicon nitride.

10. The method of claim 6, wherein a height of the first epitaxial feature is substantially equal to a height of the second epitaxial feature.

11. The method of claim 6, wherein the first epitaxial feature is a p-type epitaxial feature that extends to a first depth within the first semiconductor layer stack, and
wherein the second epitaxial feature is an n-type epitaxial feature that extends to a second depth within the second semiconductor layer stack, the second depth being greater than the first depth.

12. A method comprising:
forming a first fin and a second fin over a substrate;
forming a first pattern layer on the first fin;
removing a first portion of the first pattern layer and a first portion of the first fin, wherein a second portion of the first pattern layer is disposed on a second portion of the first fin after the removing of the first portion of the first pattern layer and the first portion of the first fin;
forming a first trench in the first fin while using the second portion of the first pattern layer as a mask, the first trench having a first width at an interface with a top surface of the first fin;
forming a first source/drain feature in the first trench such that the first source/drain feature has the first width at the interface with the top surface of the first fin, wherein the first source/drain feature is a p-type source/drain feature that extends to a first depth within the first fin;
forming a second pattern layer on the second fin;
removing a first portion of the second pattern layer and a first portion of the second fin, wherein a second portion of the second pattern layer is disposed on a second portion of the second fin after the removing of the first portion of the second pattern layer and the first portion of the second fin;
forming a second trench in the second fin while using the second portion of the second pattern layer as a mask, the second trench having a second width at an interface with a top surface of the second fin, the second width being different than the first width; and
forming a second source/drain feature in the second trench such that the second source/drain feature has the second width at the interface with the top surface of the second fin wherein the second source/drain features is an n-type source/drain feature that extends to a second depth within the second fin, the second depth being greater than the first depth.

13. The method of claim 12, further comprising removing the second portion of the first pattern layer prior to forming the second pattern layer on the second fin.

14. The method of claim 12, wherein the first trench extends to a first depth within the first fin and the second trench extends to a second depth within the second fin, the second depth being different than the first depth.

15. The method of claim 12, wherein a portion of the first fin is exposed after the removing of the first portion of the first pattern layer and the first portion of the first fin.

16. The method of claim 12, wherein the forming of the first source/drain feature in the first trench includes:
forming a first semiconductor layer in the first trench, the first semiconductor layer including a dopant at a first concentration; and
forming a second semiconductor layer in the first trench, the second semiconductor layer includes the dopant at a second concentration that is different than the first concentration.

17. The method of claim 12, wherein the forming of the second pattern layer on the second fin includes forming the second pattern layer on the first fin, and
wherein the second pattern layer covers the first fin during the forming of the second source/drain feature in the second trench.

18. The method of claim 12, wherein forming the first source/drain feature in the first trench includes forming a first semiconductor layer in the first trench and a second semiconductor layer over the first semiconductor layer in the first trench,
wherein forming the second source/drain feature in the second trench includes forming a third semiconductor layer in the second trench and a fourth semiconductor layer over the third semiconductor layer in the second trench, and
wherein a first ratio of a height of the second semiconductor layer to a height of the first source/drain feature is less than a second ratio of a height of the fourth semiconductor layer to a height of the second source/drain feature.

19. The method of claim 12, further comprising forming a spacer layer on the first fin prior to forming the first pattern layer on the first fin.

20. The method of claim 19, wherein forming the spacer layer on the first fin includes forming the spacer layer directly on the first fin.

* * * * *